United States Patent
Bhalla et al.

(10) Patent No.: US 9,917,180 B2
(45) Date of Patent: Mar. 13, 2018

(54) TRENCHED AND IMPLANTED BIPOLAR JUNCTION TRANSISTOR

(71) Applicant: UNITED SILICON CARBIDE, INC., Monmouth Junction, NJ (US)

(72) Inventors: Anup Bhalla, Princeton Junction, NJ (US); Leonid Fursin, Monmouth Junction, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 0 days.

(21) Appl. No.: 15/114,263

(22) PCT Filed: Feb. 10, 2015

(86) PCT No.: PCT/US2015/015156
§ 371 (c)(1),
(2) Date: Jul. 26, 2016

(87) PCT Pub. No.: WO2015/120432
PCT Pub. Date: Aug. 13, 2015

(65) Prior Publication Data
US 2017/0005183 A1 Jan. 5, 2017

Related U.S. Application Data

(60) Provisional application No. 61/937,798, filed on Feb. 10, 2014.

(51) Int. Cl.
*H01L 29/70* (2006.01)
*H01L 29/732* (2006.01)
(Continued)

(52) U.S. Cl.
CPC ........ *H01L 29/732* (2013.01); *H01L 27/0664* (2013.01); *H01L 29/0619* (2013.01);
(Continued)

(58) Field of Classification Search
CPC ............ H01L 29/7325; H01L 29/0619; H01L 29/42304; H01L 29/66068; H01L 29/8611;
(Continued)

(56) References Cited

U.S. PATENT DOCUMENTS 5,426,316 A  6/1995  Mohammad
6,121,633 A  9/2000  Singh
(Continued)

FOREIGN PATENT DOCUMENTS

EP         1 251 555      10/2002
WO    WO 2012/104322     8/2012

OTHER PUBLICATIONS

Chen et al., "A New Trench Base-Shielded Bipolar Transistor", IEEE Transactions on Electron Devices, vol. 47 (8), 2000, pp. 1662-1666.
(Continued)

*Primary Examiner* — Kevin M Picardat
(74) *Attorney, Agent, or Firm* — Baker & Hostetler LLP

(57) ABSTRACT

The present invention concerns a monolithically merged trenched-and-implanted Bipolar Junction Transistor (TI-BJT) with antiparallel diode and a method of manufacturing the same. Trenches are made in a collector, base, emitter stack downto the collector. The base electrode is formed on an implanted base contact region at the bottom surface of the trench. The present invention also provides for products produced by the methods of the present invention and for apparatuses used to perform the methods of the present invention.

20 Claims, 43 Drawing Sheets

(51) Int. Cl.
*H01L 29/423* (2006.01)
*H01L 29/66* (2006.01)
*H01L 29/872* (2006.01)
*H01L 29/10* (2006.01)
*H01L 29/16* (2006.01)
*H01L 29/20* (2006.01)
*H01L 29/73* (2006.01)
*H01L 29/861* (2006.01)
*H01L 29/06* (2006.01)
*H01L 27/06* (2006.01)

(52) U.S. Cl.
CPC ...... *H01L 29/1004* (2013.01); *H01L 29/1608* (2013.01); *H01L 29/2003* (2013.01); *H01L 29/42304* (2013.01); *H01L 29/6631* (2013.01); *H01L 29/66068* (2013.01); *H01L 29/66272* (2013.01); *H01L 29/66295* (2013.01); *H01L 29/73* (2013.01); *H01L 29/8611* (2013.01); *H01L 29/872* (2013.01)

(58) Field of Classification Search
CPC ............... H01L 29/872; H01L 29/8725; H01L 21/8222; H01L 21/8248; H01L 21/8249; H01L 27/0647–27/067; H01L 27/075–27/0783; H01L 29/1004–29/1008; H01L 29/66234–29/66348; H01L 29/70–29/749; H01L 29/87
USPC ...................................................... 257/565
See application file for complete search history.

(56) References Cited

U.S. PATENT DOCUMENTS

| | | | |
|---|---|---|---|
| 6,406,965 B1* | 6/2002 | Lammert | H01L 27/0664 257/E21.359 |
| 2003/0160302 A1* | 8/2003 | Sankin | H01L 29/732 257/565 |
| 2006/0043474 A1 | 3/2006 | Kinzer | |
| 2012/0007176 A1 | 1/2012 | Kadow | |
| 2012/0161286 A1* | 6/2012 | Bhalla | H01L 27/0647 257/577 |

OTHER PUBLICATIONS

Gradinaru et al., "High voltage high frequency silicon bipolar transistors" Proceedings ISPSD'1999, pp. 293-296.
Kondo et al., "A new bipolar transistor—GAT" Japanese Journal of Applied Physics, vol. 18, 1979, supplement 18-1, pp. 329-333.
Zhao et al. 6A, 1kV 4H-SiC Normally-off Trenched-and-Implanted Vertical JFETs Materials Science Forum vols. 457-460 (2004) pp. 1213-1216.

* cited by examiner

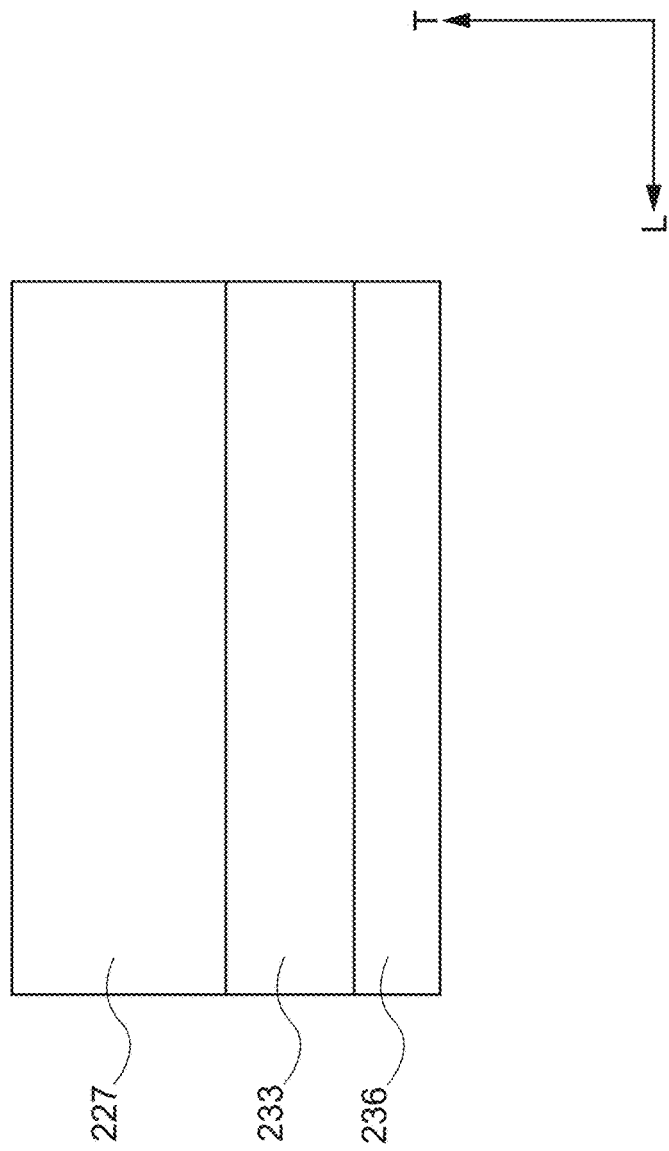

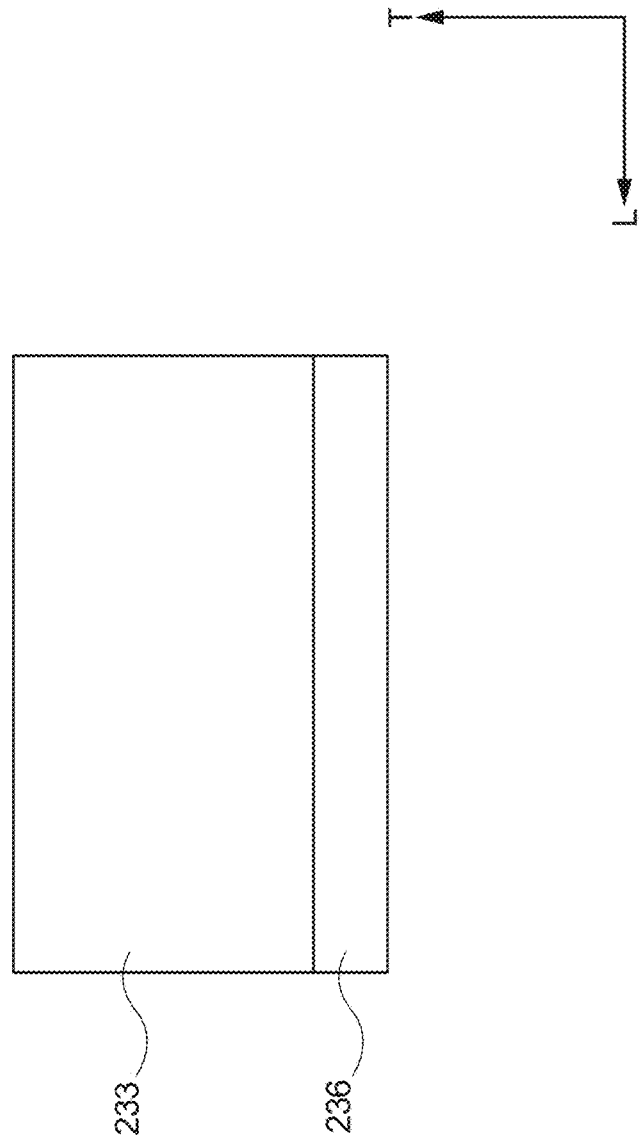

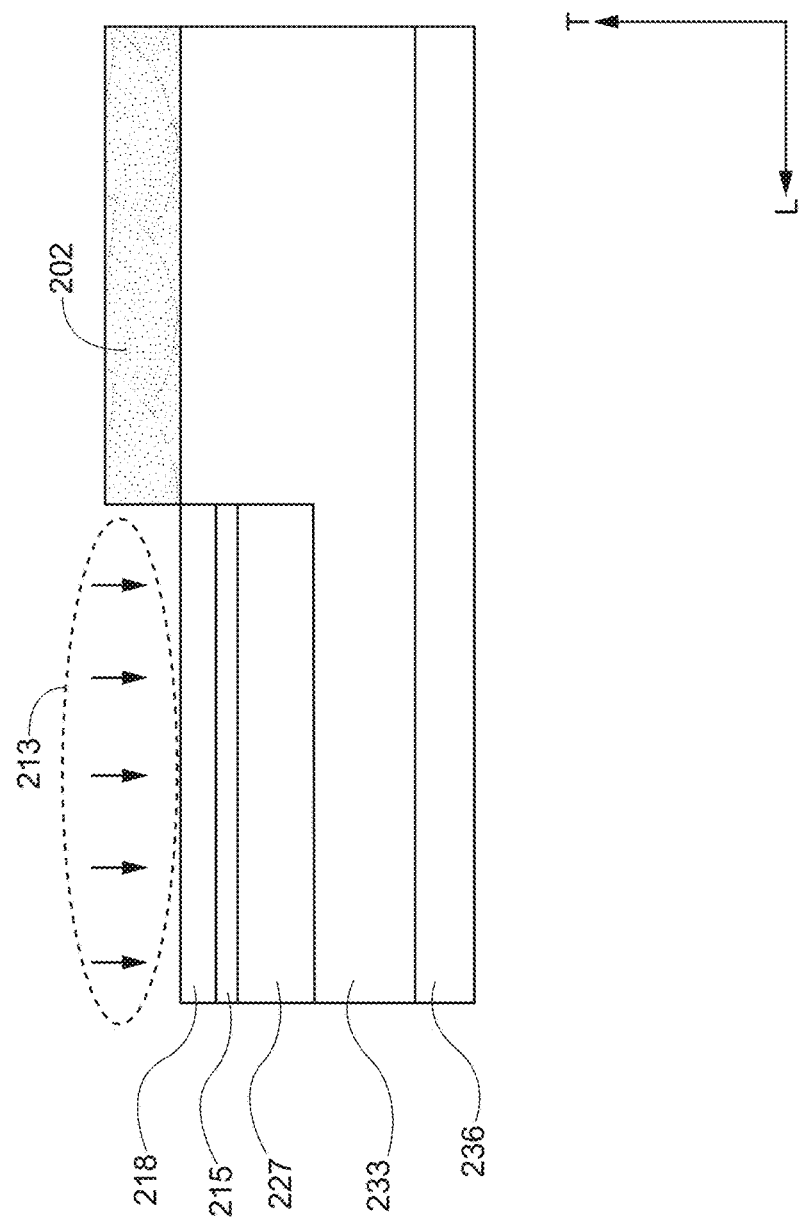

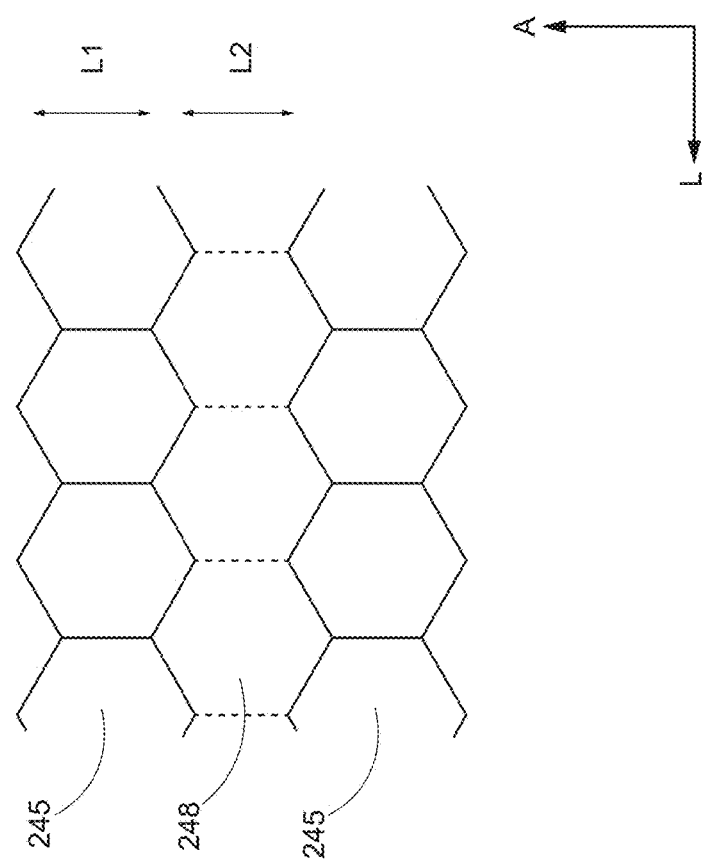

TRENCHED AND IMPLANTED BIPOLAR JUNCTION TRANSISTOR

CROSS-REFERENCE TO RELATED APPLICATIONS

This application is a National Stage Application filed under 35 U.S.C. 371 of International Application No. PCT/US2015/015156, filed Feb. 10, 2015, which claims the benefit of priority of U.S. provisional application No. 61/937,798, filed Feb. 10, 2014, the disclosure of which is hereby incorporated by reference, as if written herein in its entirety.

FIELD OF THE INVENTION

The disclosed invention is in the field of high-current and high-voltage semiconductor devices, such as, for example, a trenched and implanted bipolar junction transistor (TI-BJT) and methods of making the same.

BACKGROUND OF THE INVENTION

The high voltage BJT is of great interest for power conversion applications, as it is a normally-off device with very low conduction losses. One disadvantage of high voltage BJTs is a low common emitter current gain, which may include complications in building necessary gate drivers to supply the high continuous base current needed to support the BJT in its on-state. Additionally, the base layer of a BJT may have to be thicker than the maximum depletion region extension into the base in the blocking mode, to avoid a "punch-through" breakdown. This may impose limitations in the minimum thickness of the base layer and doping, and may limit the common emitter current gain.

Thus, there is a need for a BJT with improved performance characteristics, where a high common emitter current gain may be achieved without compromising blocking capability. The invention is directed to these and other important needs.

SUMMARY OF THE INVENTION

In accordance with the various embodiments disclosed herein, a trenched-and-implanted bipolar junction transistor (TI-BJT) is disclosed. The TI-BJT may include a drift layer of a second conductivity type; a channel layer of the second conductivity type formed on top of the drift layer; a base layer of a first conductivity type formed on top of the channel layer, wherein the base layer has a thickness which extends along a first direction, wherein the thickness is in the range of 0.02 to 2 microns; and an emitter layer of the second conductivity type formed on top of the base layer, the emitter layer having a bottom surface located adjacent to the base layer and a top surface opposite the first bottom surface along the first direction. The TI-BJT may also include at least one U-shaped trench formed in at least the emitter layer, base layer, and channel layer. The at least one U-shaped trench may include: a first side surface, a second side surface, and a bottom surface, the first side surface, second side surface, and the bottom surface being substantially planar; the first and the second side surfaces spaced apart along a second direction, the second direction being perpendicular to the first direction, the first and second side surfaces extending (1) along the first direction, (2) from the top surface of the emitter layer to the bottom surface of the at least one U-shaped trench, and (3) through the emitter layer, through the base layer, and at least partially into the channel layer; and the bottom surface of the at least one U-shaped trench extending (1) along the second direction and (2) between the first and the second wall of the at least one U-shaped trench. The TI-BJT may further include at least one implanted U-shaped conductivity region of the first conductivity type, the U-shaped region of the first conductivity type comprising: a first portion extending along the bottom surface of the at least one U-shaped trench; a second portion and a third portion extending (1) along the first and the second side surfaces of the at least one U-shaped trench, respectively, and (2) between the bottom surface of the emitter layer and the bottom surface of the at least one U-shaped trench; and a base electrode disposed between the first and the second side surfaces of the at least one U-shaped trench.

In another embodiment, the TI-BJT may also include a second U-shaped trench formed in the emitter layer, base layer, and channel layer, the second U-shaped trench including: a first side surface, a second side surface, and a bottom surface, the first side surface, second side surface, and the bottom surface being substantially planar; the first and the second side surfaces of the second U-shaped trench spaced apart along a second direction, the second direction being perpendicular to the first direction, the first and second side surfaces extending (1) along the first direction, (2) from the top surface of the emitter layer to the bottom surface of the second U-shaped trench, and (3) through the emitter layer, through the base layer, and at least partially into the channel layer; and the bottom surface of the second U-shaped trench extending (1) along the second direction and (2) between the first and the second wall of the second U-shaped trench; a second implanted U-shaped conductivity region of the first conductivity type, the U-shaped region of the first conductivity type comprising: a first portion extending along the bottom surface of the second U-shaped trench; a second portion and a third portion extending (1) along the first and the second side surfaces of the second U-shaped trench, respectively, and (2) between the bottom surface of the emitter layer and the bottom surface of the second U-shaped trench; and a base electrode disposed between the first and the second side surfaces of the second U-shaped trench. The TI-BJT may also include at least one mesa, the at least one mesa comprising: a first side wall defined by the first side wall of the at least one U-shaped trench and a second side wall defined by the second side wall of the second U-shaped trench; and an unetched region of the emitter layer, base layer, and channel layer extending between the first and the second side walls of the at least one mesa.

In yet another embodiment, the TI-BJT may include an antiparallel diode, monolithically integrated with the TI-BJT, the antiparallel diode comprising an anode electrode and a cathode electrode; a first electric connection between the emitter electrode of the TI-BJT and the anode electrode of the antiparallel diode; wherein the collector electrode of the TI-BJT is the cathode electrode of the antiparallel diode; an electrically inactive isolation region, the electrically inactive isolation region providing an electric isolation between the anode electrode of the antiparallel diode and the base electrode of the BJT, wherein the electrically inactive isolation region increases voltage blocking capability between the BJT base and JBS anode; and a shared edge termination region for the TI-BJT and the antiparallel diode.

In another further embodiment of an integrated TI-BJT and antiparallel diode, the TI-BJT may include at least one of the first side and the second side of the at least one U-shaped trench of the TI-BJT extend a first distance along the first direction, and the emitter layer and the base layer of the TI-BJT formed by ion implantation of the channel layer. The antiparallel diode may include a trenched-and-implanted Junction Barrier Schottky diode (TI-JBS diode), the TI-JBS diode comprising: the drift layer; the channel layer; two adjacent trenches, the two adjacent trenches spaced a second distance from one another along the second direction; and at least one of the two adjacent trenches having a depth that extends the first distance along the first direction; and a mesa, the mesa comprising: a first side wall and a second side wall of the mesa defined by the depth of the at least two adjacent trenches; an unetched and implanted region of the channel layer extending between the first and the second side walls of the mesa, the unetched and implanted region of the mesas including a top surface of the channel layer that is coplanar with the top surface of the emitter layer of the TI-BJT along the second direction; and a second and a third implanted conductivity region of the first conductivity type extending along the first and second side walls of the mesa, respectively; and an electrical contact formed on the top surface of the mesa.

In another embodiment of an integrated TI-BJT and antiparallel diode, the TI-BJT may include the emitter, base, and channel layers of the TI-BJT formed by ion implantation of the drift layer. The antiparallel diode may include an unetched Junction Barrier Schottky diode (JBS diode) comprising: the drift layer, the drift layer including a top surface that is coplanar with the top surface of the emitter layer of the TI-BJT along the second direction; a second and a third implanted conductivity region of the first conductivity type extending from the top surface of the drift layer into the drift layer, the second and third implanted conductivity regions being separated by an implanted region of the second conductivity type along the second direction; and a vertical etched step extending along the first direction, the vertical etched step disposed between the isolation region and the second and third implanted regions along the second direction.

In yet another embodiment of an integrated TI-BJT and antiparallel diode, the TI-BJT may include the emitter, base, and channel layers of the TI-BJT formed by ion implantation of the drift layer. The antiparallel diode may include a planar, unetched Junction Barrier Schottky diode (JBS diode) comprising: the drift layer, the drift layer including a top surface that is coplanar with the top surface of the emitter layer of the TI-BJT along the second direction; a second and a third implanted conductivity region of the first conductivity type extending from the top surface of the drift layer into the drift layer, the second and third implanted conductivity regions being separated by an implanted region of the second conductivity type along the second direction; and a sloped side wall extending along the first and the second directions, the sloped side wall disposed between the isolation region and the second and third implanted regions along the second direction.

In yet another embodiment of an integrated TI-BJT and antiparallel diode, the TI-BJT may include at least one of the first side and the second side of the at least one U-shaped trench of the TI-BJT extend a first distance along the first direction, and the emitter, base, and channel layers of the TI-BJT are formed epitaxially. The antiparallel diode may include a trenched-and-implanted Junction Barrier Schottky diode (TI-JBS diode), the TI-JBS diode comprising: the drift layer; the channel layer; two adjacent trenches, the two adjacent trenches spaced a second distance from one another along the second direction; and at least one of the two adjacent trenches having a depth that extends a third distance along the first direction, the third distance being less than the first distance; and a mesa, the mesa comprising: a first side wall and a second side wall of the mesa defined by the depth of the at least two adjacent trenches; an etched and implanted region of the channel layer extending between the first and the second side walls of the mesa, the etched and implanted region of the mesa including a top surface of the channel layer that is below with the top surface of the emitter layer of the TI-BJT along the first direction extending from the emitter layer towards the base layer; and a second and a third implanted conductivity region of the first conductivity type extending along the first and second side walls of the mesa, respectively; and an electrical contact formed on the top surface of the mesa.

In an embodiment of an integrated TI-BJT and antiparallel diode, the TI-BJT may include the emitter, base, and channel layers of the TI-BJT are formed epitaxially or by ion implantation. The antiparallel diode may include a planar, etched Junction Barrier Schottky diode (JBS diode) comprising: the drift layer, the drift layer being implanted and including an etched top surface that is disposed below the channel layer of the TI-BJT along the first direction extending from the emitter layer towards the channel layer; a second and a third implanted conductivity region of the first conductivity type extending from the top surface of the drift layer into the drift layer, the second and third implanted conductivity regions being separated by an implanted region of the second conductivity type along the second direction.

Methods of forming the above embodiments are also disclosed herein.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings:

FIGS. 2K-2S illustrate a cross-sectional view of an exemplary method of manufacturing a TI-BJT with implanted emitter and base, monolithically integrated with trenched-and-implanted Junction Barrier Schottky (JBS) diode.

FIGS. 3A-3F illustrate a cross-sectional view of another exemplary method of manufacturing a TI-BJT with implanted emitter and base, monolithically integrated with trenched-and-implanted JBS diode.

FIG. 6C illustrates a schematic device cell layout of another exemplary embodiment of the TI-BJT and implanted monolithically integrated JBS diode regions, with a hexagonal cell arrangement of BJT and JBS cells.

DETAILED DESCRIPTION OF ILLUSTRATIVE EMBODIMENTS

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any sub combination. Further, reference to values stated in ranges include each and every value within that range.

In an exemplary embodiment of the invention, the first conductivity type and the second conductivity type may refer to p-type and n-type, respectively, or n-type and p-type respectively. It should be understood that the exemplary systems described herein may contain layers and regions of a first conductivity type and a second conductivity type. Layer may also be understood to be region. It should be understood that a BJT may also be referred to as a high-voltage switch, a switch or a transistor.

Figure 1A:
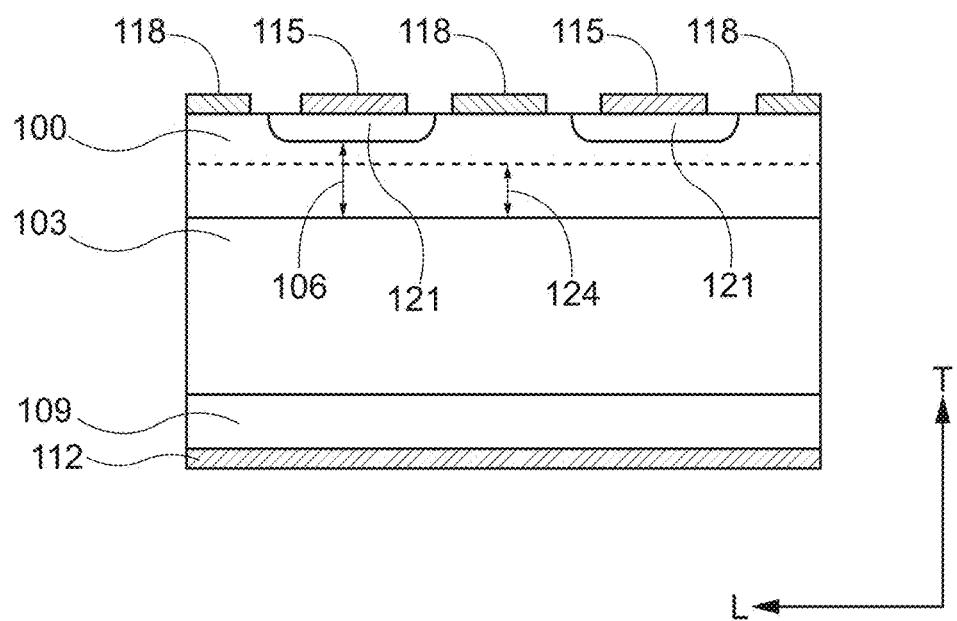
FIG. 1A illustrates an exemplary view of a schematic cross sectional view of a high-voltage BJT transistor.

FIG. 1A illustrates an exemplary view of a schematic cross-sectional view of a high-voltage BJT transistor. FIG. 1A illustrates a power unit cell of the BJT. As illustrated in FIG. 1A, the BJT may be comprised of one or more layers of substrate 109 of second conductivity type, collector ohmic contact 112, drift layer 103 of second conductivity type, base layer 100 of first conductivity type, base layer 100 of thickness 106, base ohmic contacts 118, emitter layer 121 of second conductivity type, and emitter ohmic contacts 115. It should be understood that the base layer 100 may also be referred to as an intrinsic base region or an intrinsic base. As further depicted in FIG. 1A, when a BJT supports high voltage, for example, its drift layer 103 may fully or partially be depleted, and depletion region 124 may be formed. For example, if the thickness of the depletion region 124 reaches through the thickness 106 of the base layer 100, for example, a "punch-through" breakdown may occur. It should be understood that the emitter layer 121 may, as a result, become effectively shorted with the collector layer 109 and result in potentially catastrophic consequences. As further depicted in FIG. 1A, the thickness 106 of the base layer 100 may, for example, need to support the maximum depletion 124 width in the blocking mode. The base layer 100 may need to be thick enough and its doping may need to be high enough to support the maximum depletion 124 width into the base layer 100 in the blocking mode. In one example, increasing the thickness 106 of the base layer 100 and the doping level may lead to reduction in the BJT's common emitter current gain. To achieve the same level of collector forward current, for example, may require a higher base current drive capability.

In one example, high voltage BJTs, a normally-off device, may have a low common emitter current gain and complications may arise in building necessary gate drivers to supply a high continuous base current to support the BJT in its on-state or turn-off the BJT rapidly. For example, the base layer 100 of a BJT may have to be thicker than the maximum depletion region 124 in a blocking mode to avoid a "punch-through" breakdown. This may impose limitations on the minimum thickness 106 of the base layer 100 and doping, and hence limit the common emitter current gain.

In accordance with the exemplary embodiments described herein, various trenched and implanted BJTs (TI-BJTs) are been described which possess an epitaxial structure with only n-type layers that requires no epitaxial regrowth or deep ion implantations. Exemplary embodiments of the invention may also include monolithic integration of, for example, a BJT device with various antiparallel diode structures (such as JBS diodes), and various layouts in a device cell and its integration with the edge termination region at the device periphery. JBS diodes may be replaced with PiN diodes or pure SBD (Schottky Barrier Diodes). A JBS diode may also be understood to be a Schottky or a Schottky diode. An anti-parallel diode may also be understood to be a diode. It should be understood that an anti-parallel diode may also be referred to as a diode, a JBS diode or a Schottky or a Schottky diode. It should also be understood that a JBS diode may also be referred to as a diode.

Figure 1B:
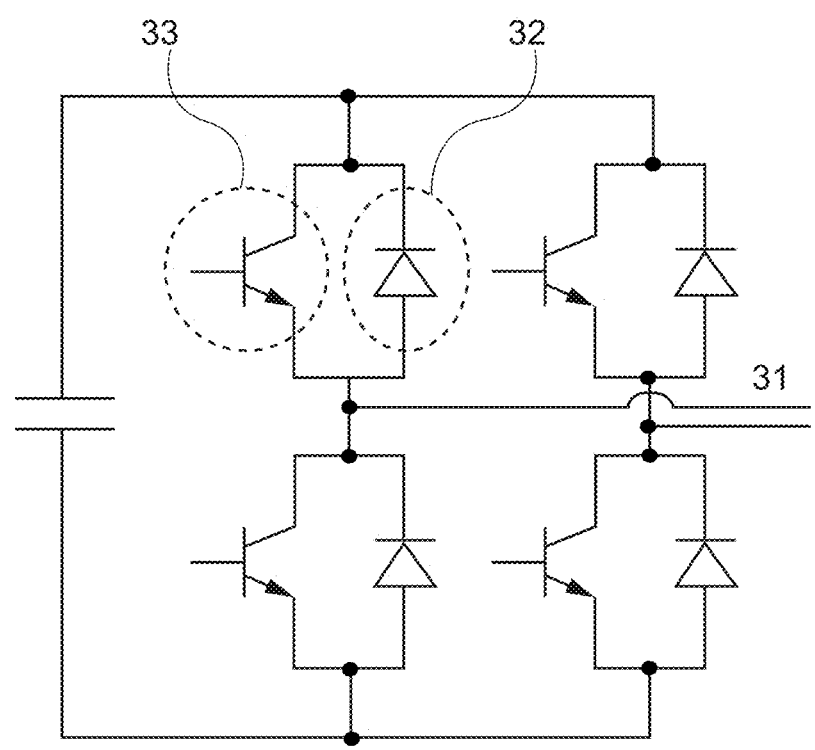
FIG. 1B illustrates an exemplary full bridge circuit application of a TI-BJT.

FIG. 1B illustrates a full bridge circuit application of the TI-BJT. As shown in FIG. 1B, an exemplary circuit application of the TI-BJT may comprise a diode 32 and a TI-BJT 33 in each of the four switch locations, where 31 refers to power output of the circuit. It should be understood that the integrated TI-BJT 33 and diode 32 circuit may be also be configured in half-bridge circuits, three phase bridge circuits and multi-level converter circuits, or the like, or any appropriate combination thereof. In hard switched applications, for example, using a JBS diode may eliminate diode recovery related switching losses, which may allow for higher frequency operation, smaller passives and lower cooling requirements.

Figure 1C:
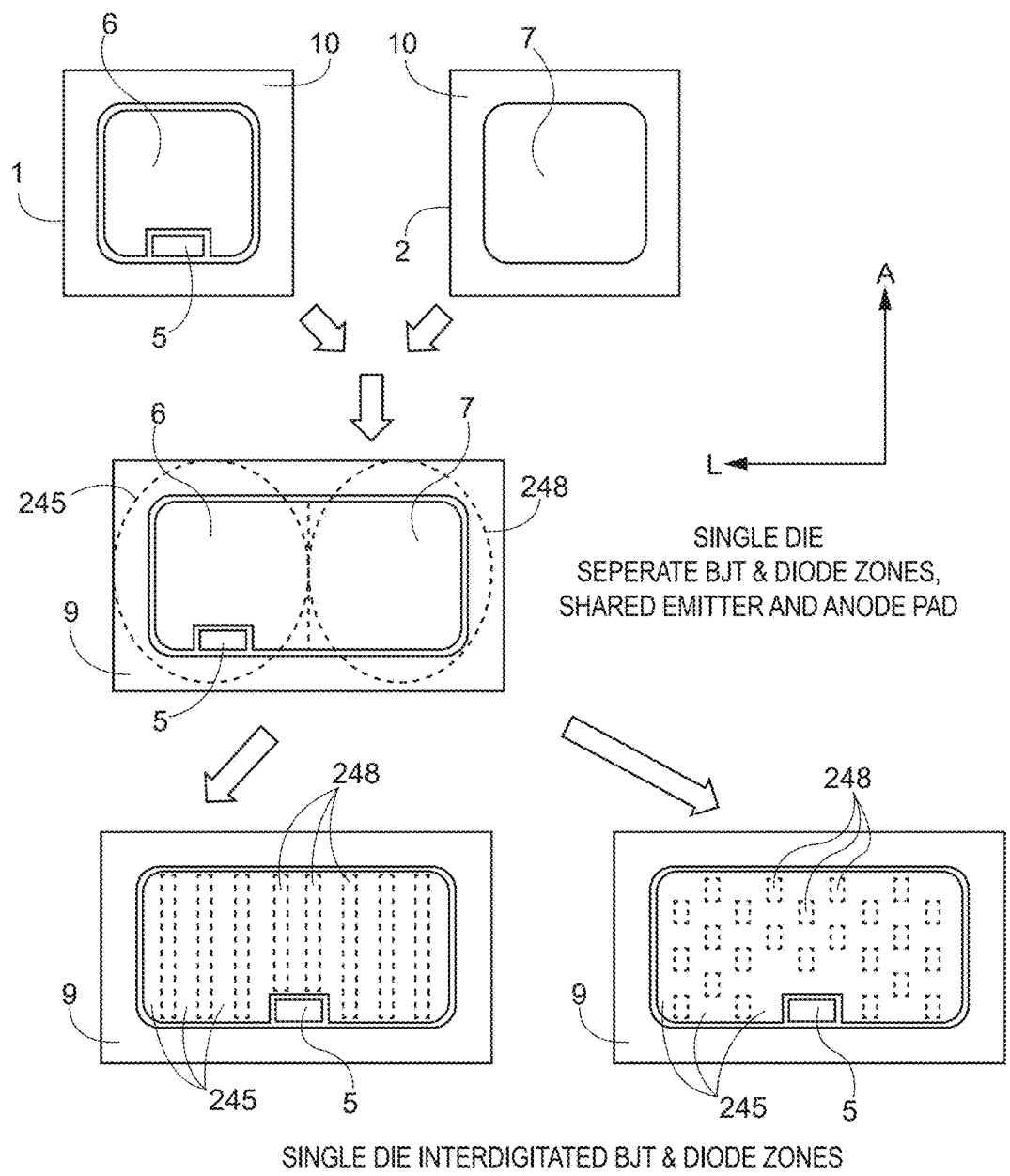
FIG. 1C illustrates an exemplary comparison of hybrid and monolithic device integration.

FIG. 1C illustrates an exemplary comparison of hybrid and monolithic device integration. FIG. 1C illustrates the difference between using two separate chips for a high-voltage switch such as a, TI-BJT 1, and diode 2 with individual edge termination regions 10 and using a single chip with a combined termination 9 around the TI-BJT 1 region and monolithically integrated diode 2. As further illustrated, FIG. 1C comprises base layer 5, emitter layer 6 and anode contact 7. Anode contacts 7 may also be understood to comprise anode bonding pads or the like. The emitter layer 6 may be shared with the anode bonding pads 7. For example, the periphery of a discrete high voltage device, for example, may include a wide edge termination 9, 10 region to improve device blocking voltage. In an example embodiment, the width of the edge termination 9, 10, for example, may be 3 to 5 times the thickness of the drift layer, and may constitute a large portion of the overall device die area. For example, in a hybrid integration that uses separate chips for the TI-BJT 245 and diode 248, the TI-BJT 245 and diode 248 may have to include a large edge termination 9 area to support high voltage in the blocking mode. The TI-BJT 245 and diode 248 may have similar requirements for the drift layer thickness and doping. In an example embodiment, monolithic integration of a TI-BJT 245 with diode 248, for example, may enable the sharing of the common edge termination 9. In an example embodiment, this may save the overall chip area and may be useful for devices with higher voltage rating. In an exemplary embodiment of the hybrid integration, for example, additional wire-bonding interconnects may be needed between the TI-BJT 245 and diode 248, which may introduce parasitic inductance. This may further limit the operating frequency of a power module and may cause excessive voltage spiking during device switching. FIG. 1C further illustrates that a TI-BJT 245 region and diode 248 region arrangement within a monolithically integrated die may vary. In an example embodiment, two separate regions may be formed, one for TI-BJT 245 and one for the diode 248. In another example embodiment, interdigitated TI-BJT 245 regions and diode 248 regions may be formed throughout the entire die active area. In an example embodiment, such an arrangement may help to reduce the impact of the substrate layer and drift layer resistance.

FIGS. 2A-2J illustrate an exemplary method of manufacturing a discrete TI-BJT 245.

Figure 2A:
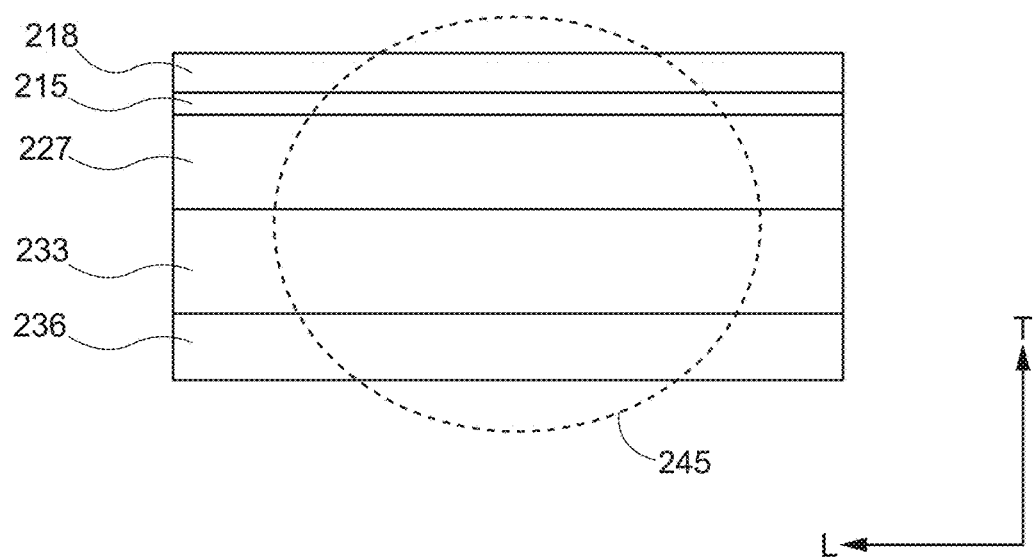
FIGS. 2A-2I illustrate a cross-sectional view of an exemplary method of manufacturing a TI-BJT with implanted emitter and base.

FIG. 2A illustrates a cross sectional side view an exemplary embodiment of the initial wafer structure for the TI-BJT 245 with an implanted emitter layer 218 and base layer 215. In an example embodiment, the emitter layer 218 and base layer 215 may be also be formed by ion co-implantation over the entire surface using dopants of the first conductivity type for the base layer 215, and second conductivity type for the emitter layer 218. FIG. 2A illustrates a typical original wafer structure, which may comprise substrate 236 of second conductivity type, drift layer 233 of second conductivity type, an epitaxially grown channel layer 227 of second conductivity type, a base layer 215 of first conductivity type and an emitter layer 218 of second conductivity type.

Figure 2B:
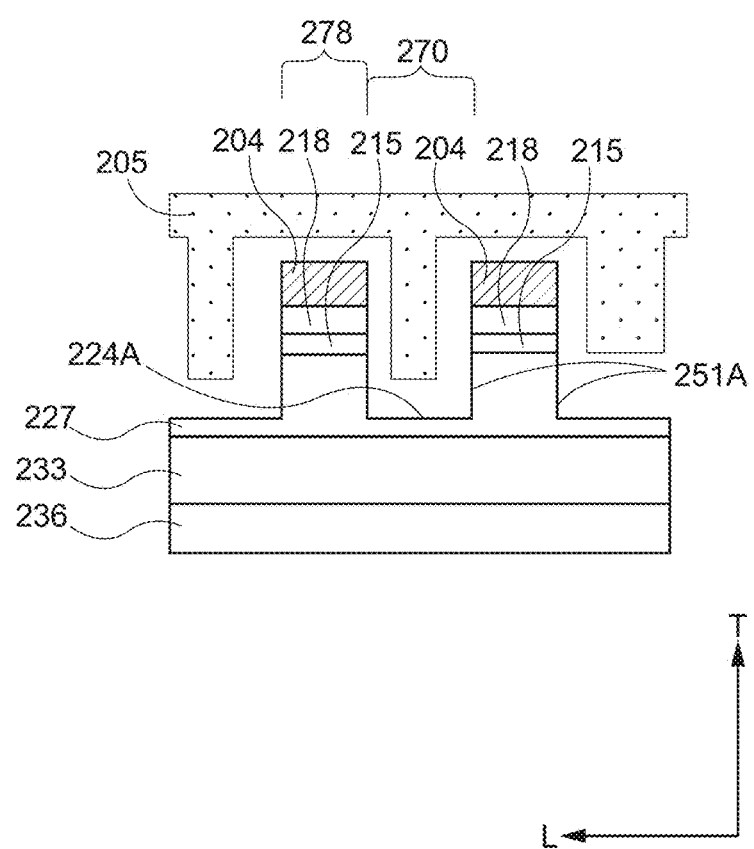

FIG. 2B illustrates an exemplary trench 270 and mesa 278 formation with plasma etching 205 for the TI-BJT 245. In an example embodiment, the plasma etching 205 may penetrate through the emitter layer 218, base layer 215, and most or all of the channel layer 227, and stop within or just short of the drift layer 233. For example, the etching mask 204 may be of a thickness to withstand plasma etching 205, block the subsequent ion implantations and prevent dopant compensation in emitter layer 218. It should be understood that the etching mask 204 may also be referred to as hardmask material or an implantation mask. A mesa 278 may be defined by and disposed between two adjacent trenches and include a portion of one or more of the emitter layer 218, base layer 215, channel layer 227, and drift layer 233. It should be understood that a mesa 278 may also be referred to as an emitter mesa.

Figure 2C:
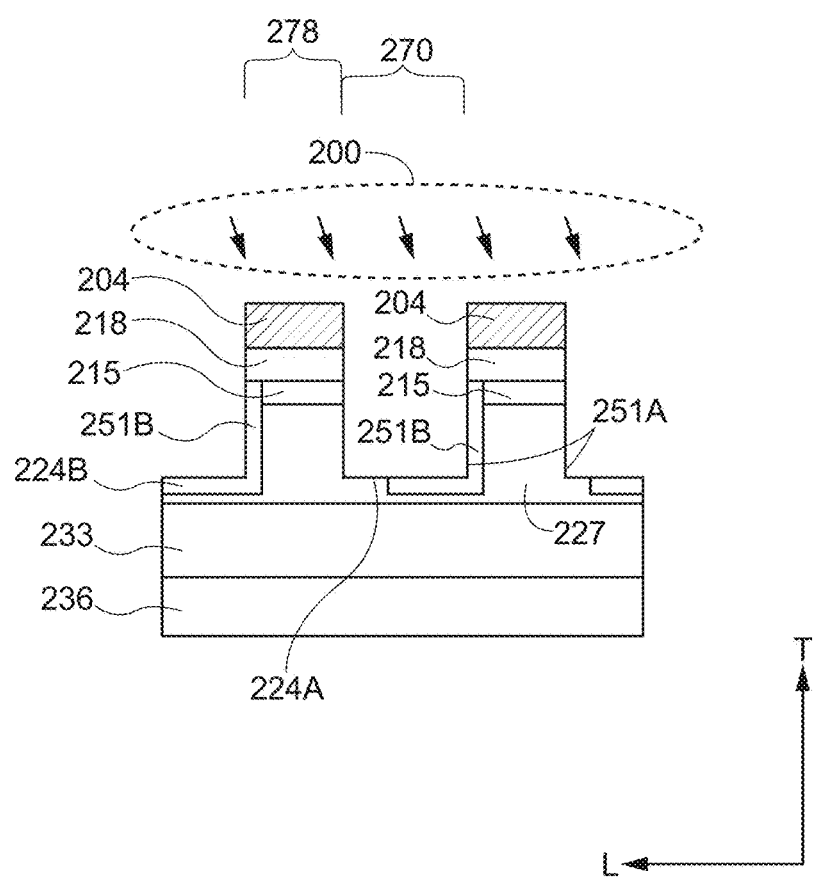

FIG. 2C illustrates an exemplary embodiment of tilted ion implantation 200 into the first side-wall of the TI-BJT. It should be understood that a tilted ion implantation may also be referred to as a side-wall ion implantation or a tilted ion implantations. As illustrated in FIG. 2C, the tilted ion implantation 200 of the first conductivity type may be performed under non-vertical conditions into one trench 270, in the side-wall 251A for the TI-BJT 245 region, forming a region of the first conductivity type 251B in the side-wall 251A of each trench 270. It should be understood that a region of the first conductivity type 251B may also be referred to as side-wall 251A implanted regions. In an example embodiment, the doping of the emitter layer 218 may, for example, be high enough to prevent the thick, heavily doped emitter layer 218 of second conductivity type from being converted to a region of first conductivity type 251B by the tilted ion implantation.

Figure 2D:
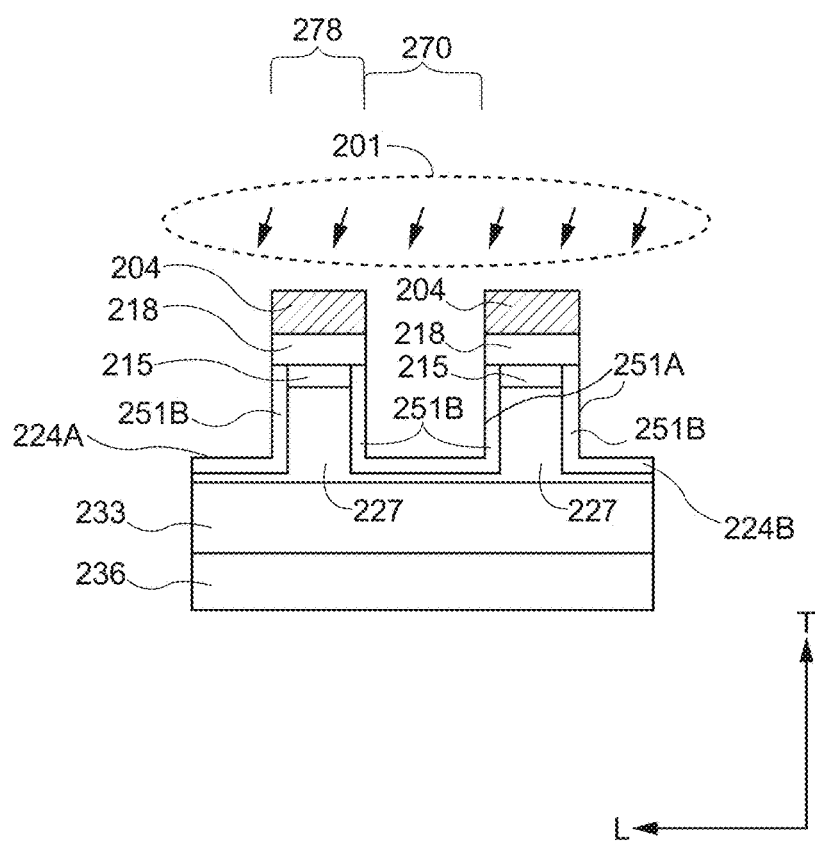

FIG. 2D illustrates an exemplary embodiment of tilted ion implants 201 into second side-wall of the TI-BJT 245 with implanted emitter layer 218 and base layer 215. FIG. 2D illustrates an exemplary ion implantation 201 of the first conductivity type, performed under non-vertical conditions into another sidewall 251A of the trench 270 for the TI-BJT 245. In an example embodiment, tilted ion implantation may form a region of first conductivity type 251B in each side-wall 251A. In another example embodiment, depending upon the implant angles used, tilted ion implantation may also create a region 224B of the first conductivity type at the bottom surface 224A of the trench 270 which may or may not fully cover the bottom surface 224A of the trench 270 at this stage.

Figure 2E:
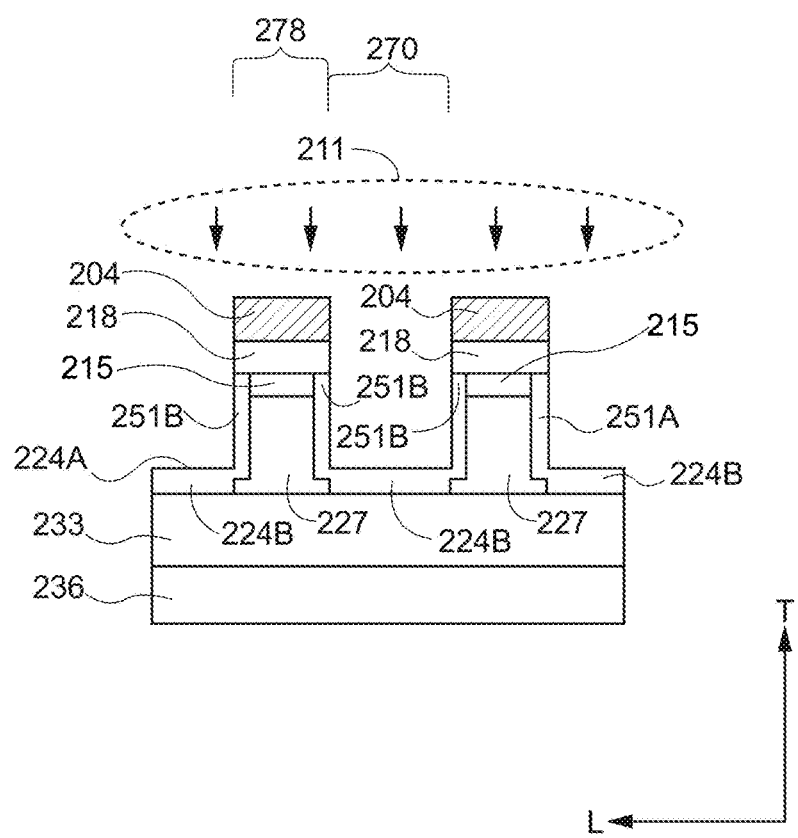

FIG. 2E illustrates an exemplary embodiment of the vertical ion implantation of first conductivity type 211, performed under a vertical angle, to form the region of first conductivity type 224B at the bottom surface 224A of the trench 270 for the TI-BJT 245. The region of the first conductivity type 224B may be formed in layer(s) adjacent to the bottom surface 224A of the trench 270. In an example embodiment, the depth of the region of first conductivity type 224B at the bottom surface 224A of the trench 270 may be in the range of 20-1000 nm. As illustrated in FIG. 2E, the layer adjacent to the bottom surface 224A of the trench 270, is the channel layer 227. The bottom surface 224A of the trench 270 may be located adjacent to the drift layer 233. In an exemplary embodiment, region 224B may extend into a second layer, such as the drift layer 233. In an example embodiment, region 224B may also define the blocking junction underneath.

Vertical ion implantation may be used in addition to tilted ion implantation to form a region 224B of the second conductivity type which fully covers the bottom surface 224A of the trench 270. Vertical ion implantation may also be used to in addition to tilted ion implantation to increase the depth of the region 251B of the first conductivity type in the layer(s) adjacent to the bottom surface 224A of the trench 270. It may be understood that region 224B may be the result of at least one of tilted ion implantation and vertical ion implantation. In an example embodiment, this vertical ion implantation 211 may cover the bottom surface 224A of the trench 270. For example, the vertical ion implantation 211 may also penetrate, for example, a certain depth into the layers of second conductivity type underneath bottom surface 224A of the trench 270, where it converts the original conductivity of the second type into the first type. The implant may also have a high surface concentration for basic ohmic contact formation. In an example embodiment, the implant may also be deep enough to form a blocking junction that does not deplete completely when the device is in its blocking mode. The blocking p-n junction may be formed, for example, at the interface between (1) bottom surface 224A of the trench 270, which is converted into first conductivity type and (2) the original layer of second conductivity type below, which may be either the channel layer 227 or drift layer 233. Additionally, the ion implants may be further activated, for example, through a high-temperature annealing process. This may consist of a thermal anneal process in a furnace, or a laser-annealing process, or the like, or an appropriate combination thereof. In an example embodiment, the etching mask 204 may then be removed. It should be understood that ion implantation may result in implanted ions, which may be referred to as implants.

Figure 2F:
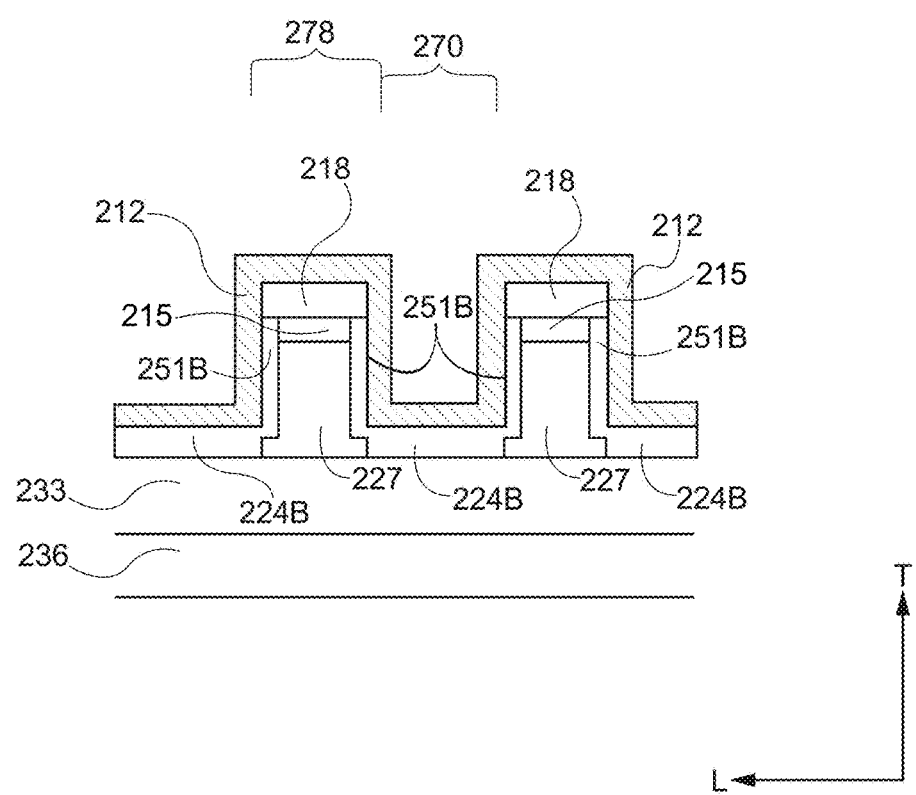

FIG. 2F illustrates an exemplary embodiment of surface passivation for the TI-BJT 245 with implanted emitter layer 218 and base layer 215. In an exemplary embodiment, surface passivation layer 212 may be a dielectric. Formation of surface passivation layer 212 may employ techniques such as, for example, stacks of thermally grown oxides, deposited plasma enhanced, low pressure chemical vapor deposition (CVD) oxides and nitrides, high density plasma oxides, atomic layer deposited dielectrics, high temperature doped, undoped CVD oxides, or the like, or an appropriate combination thereof. In an example embodiment, surface passivation may reduce surface leakage and improve blocking and bipolar injection capabilities of the base-emitter pn-junction, as well as eliminate surface breakdown paths at the device edge termination region.

Figure 2G:
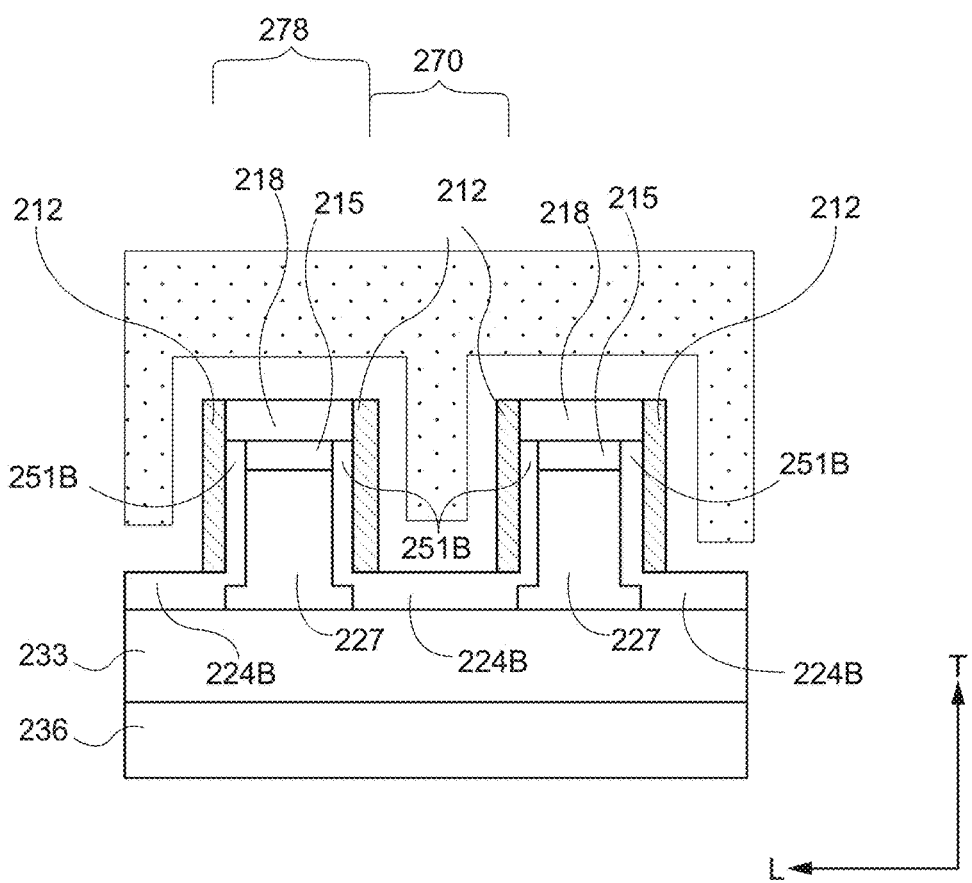

FIG. 2G illustrates the spacer formation on the side-walls by reactive ion etching to expose the regions for subsequent emitter contact and base contact formation. It should be understood that emitter contact may also be referred to as an emitter ohmic contact. It should also be understood that base contact may also be referred to as a base ohmic contact.

Figure 2H:
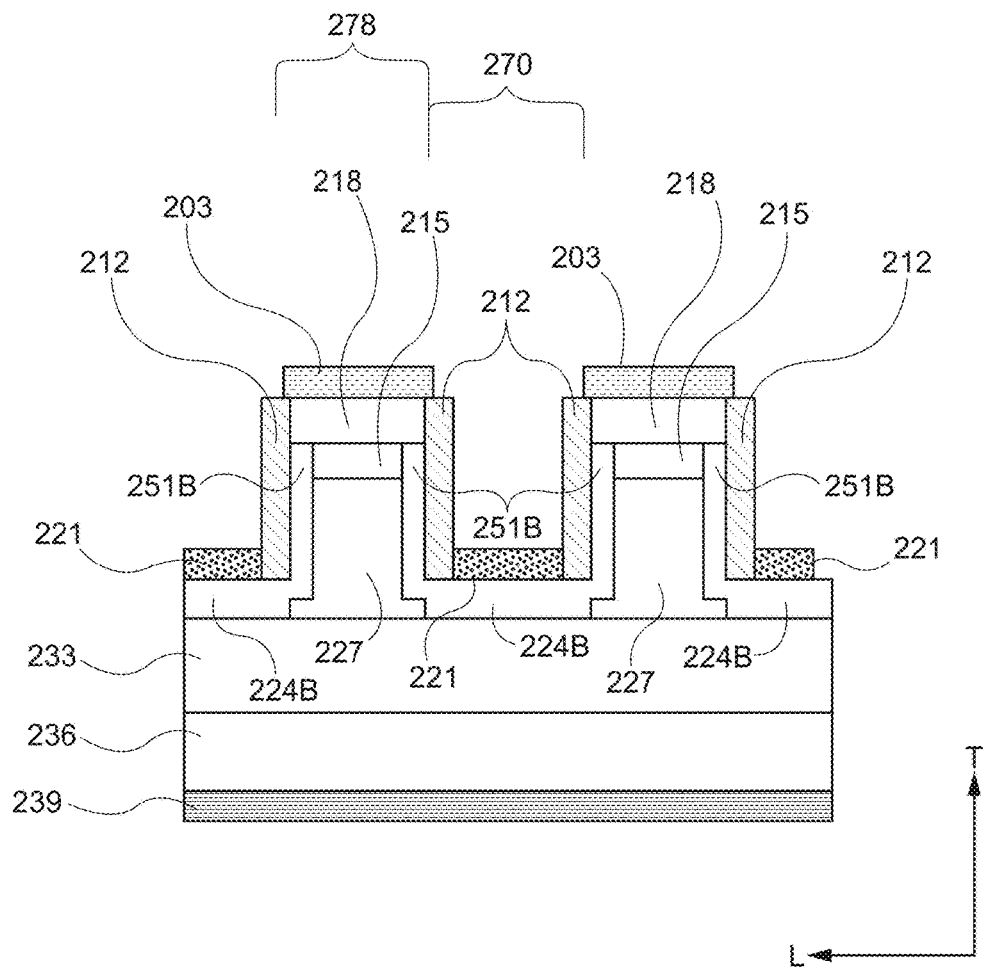

FIG. 2H illustrates an exemplary embodiment of the formation of the emitter ohmic contacts 203, base ohmic contacts 221 and collector ohmic contact 239. In an example embodiment, a high temperature annealing step may be performed separately for each contact (i.e. emitter ohmic contact 203, base ohmic contact 221, collector ohmic contact 239), or simultaneously for all three.

Figure 2I:
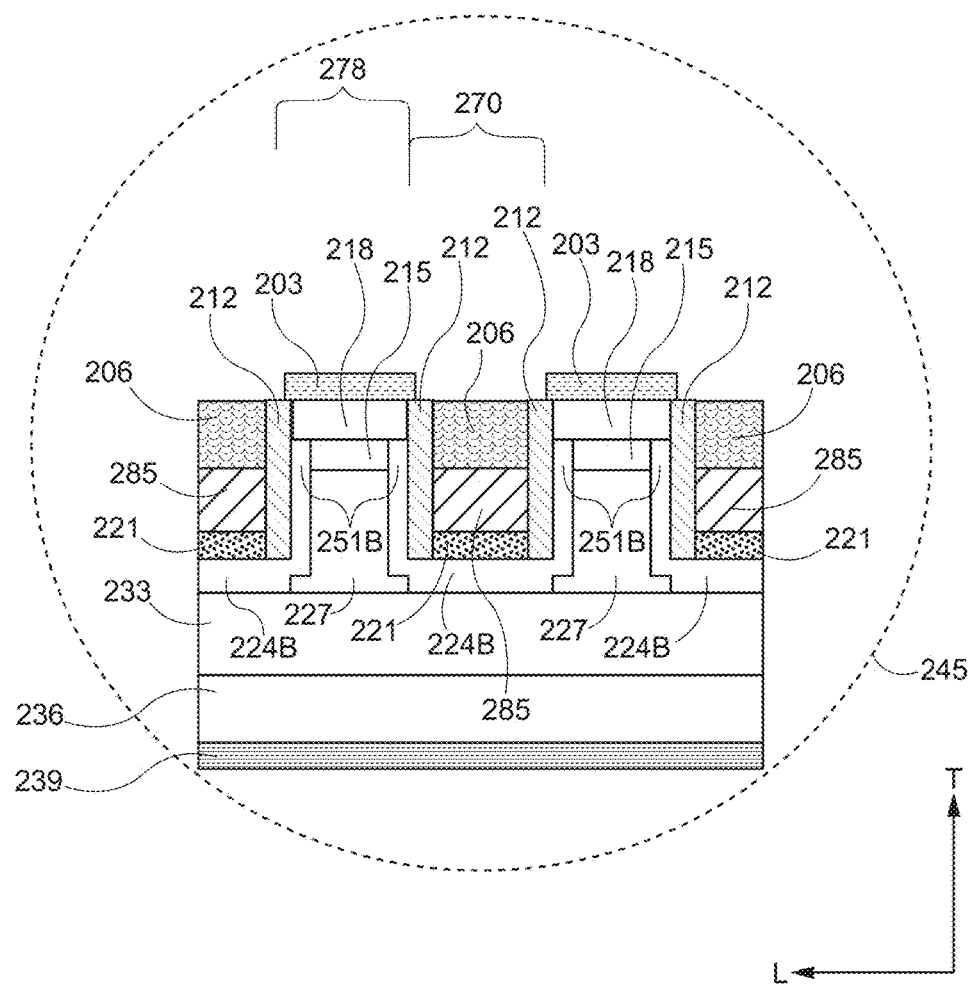

FIG. 2I illustrates the formation of the base contact overlay metal 285 and the interlayer dielectric 206.

Figure 2J:
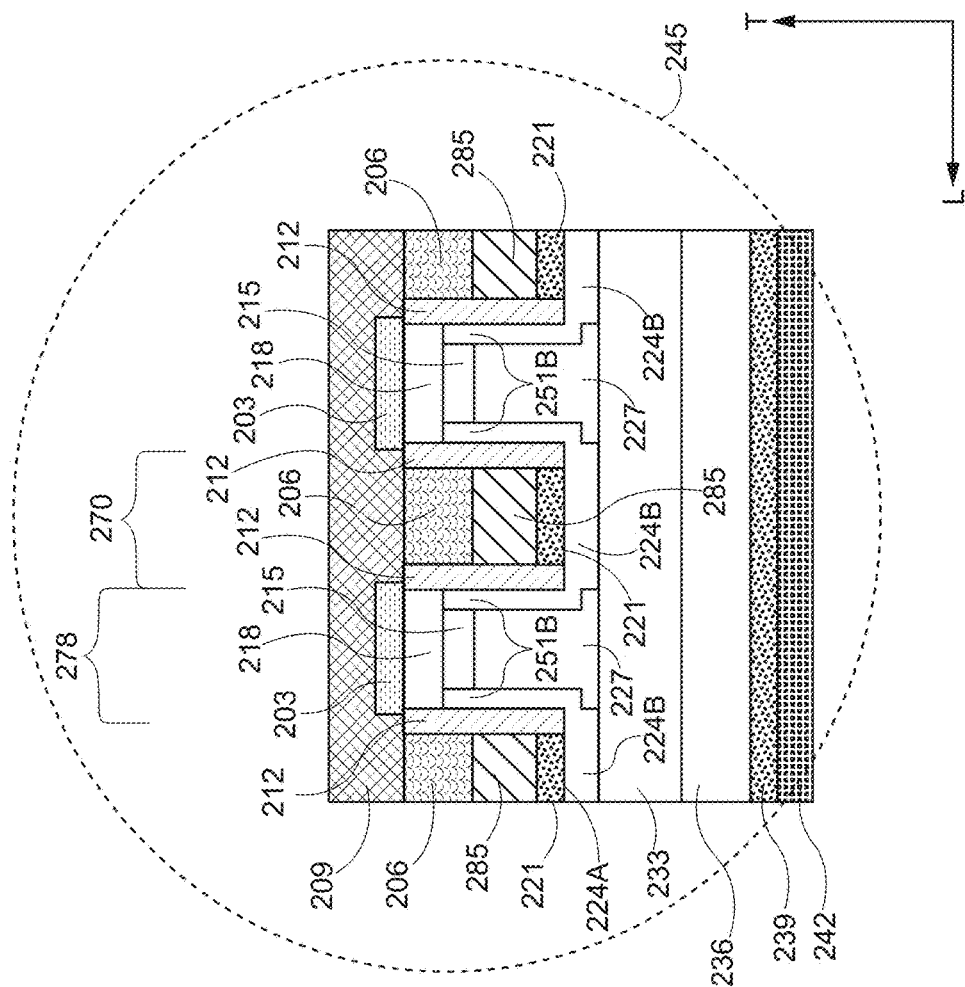
FIG. 2J illustrates a cross-sectional view of another exemplary embodiment of a fabricated TI-BJT with implanted emitter and base.

FIG. 2J illustrates an embodiment of the present invention directed to a fabricated TI-BJT 245. FIG. 2J illustrates an exemplary schematic cross-sectional view of a completed device after base contact overlay 285, interlayer dielectric 206 and collector overlay 242 are formed. The TI-BJT 245 may comprise, for example, a base layer 215 of a first conductivity type in direct interface with emitter layer 218, where electrostatic shielding may be provided for the thin base layer 215 by implanted regions of first conductivity type 251 along the side-walls 251A of the trench 270. In an example embodiment, a thinner base layer 215 with a higher value of common emitter current gain may be implemented without compromising device blocking capability. In an example embodiment, there may be no MOS interface incorporated into any active device structure, which may eliminate operational reliability as evidenced in structures such as SiC MOSFETs. In an example embodiment, a benefit of the TI-BJT 245 structure illustrated in FIG. 2J may be high value of base-emitter breakdown voltage, which may be utilized to increase the speed of device turn-off. The higher breakdown may result from the fact that the thin base layer 215 and sidewall regions are lightly doped, separating the heavily doped emitter layer 218 region from the heavily doped base layer 215 at the bottom surface 224A of the trench 270. It should be understood that emitter layer 218 may also be referred to as an emitter surface.

In an example embodiment, the trench geometry may provide versatility in the device design. A thin implanted layer of first conductivity type may be formed on the side-walls 251A of the mesa 278 with low-energy ion implanters. For example, this may result in a low-cost manufacturing process. In an example embodiment, region 224B in bottom surface 224A of the trench 270 region may provide a blocking junction and high-voltage capability. The side-wall 251A implanted regions 251B, such as the implanted regions of first conductivity type 251B may provide electrical connection to the base layer 215 and an electrostatic shielding effect of the base layer 215 in a blocking mode. In an example embodiment, the thickness of the base layer 215 and emitter layer 218, for example, may be 0.2 um and 0.25 um respectively. In another example embodiment, the base layer 215 and the emitter layer 218 may also be implanted with ion implanters with required energies, such as, for example under 360 keV for the base layer 215 and 60 KeV for the emitter layer 218. This may provide a method of uniform doping control of the base layer 215 through ion implantation instead of epitaxial growth, which may result in a uniform and reproducible common emitter current gain of the TI-BJT 245.

FIG. 2J illustrates an example embodiment that comprises a base layer 215 of a TI-BJT 245 region, which is confined between two side-walls 251A of the etched emitter mesa 278. In an example embodiment, the side-walls 251A may be subsequently implanted with the dopant of the same conductivity type as the base layer 215 (e.g., regions 251B). In an example embodiment, this may form an electrical connection to the base ohmic contact 221. In an example embodiment, the trench geometry may provide great versatility for optimizing the common emitter current gain, forward current, and device blocking voltage. In an example embodiment, the width of the base layer 215 may be made thin enough to provide a higher value of common emitter current gain because it may not need to support high voltage in a blocking mode. The base layer 215, for example, may be electrostatically shielded through depletion of the channel layer 227 when a reverse bias is applied between the collector ohmic contact 239 and the base layer 215.

For example, the blocking pn-junction in the BJT seen in FIG. 1A may have to support high voltage and may be formed of the base layer 100 and underlying drift layer 103. In an example embodiment, a thicker depletion region may be formed within a base layer 100 in blocking mode, as the depletion charge in the base layer 100 may be equal to the total charge in depleted drift layer 103, buffer layer and/or substrate layer 109.

The minimum required charge per unit area in the base layer 100 of the BJT, as depicted in FIG. 1A, may be calculated by the following formula:

$$Q_B = \epsilon_S E_C, \quad (1)$$

where $\epsilon_S$ is semiconductor permittivity and $E_C$ is the critical electric field.

$E_C$ may depend upon semiconductor material and breakdown voltage. In an example embodiment, if the base charge is smaller than this value, it may result in the total depletion of base layer 100, and a premature "punch-through" breakdown may occur.

The base charge may be calculated by the following formula:

$$Q_B = q N_B W_B, \quad (2)$$

where $N_B$ is the doping in the base layer 100, and $W_B$ is the thickness of the base layer 100. In an example embodiment, the amount of base current needed to drive the BJT in forward mode may be proportional to $\beta^{-1}$, where $\beta$ is the common emitter current gain of a BJT. A smaller base current may be useful in power conversion applications.

The common emitter current gain may have the following dependency upon the doping in the base layer 100 and the thickness of the base layer 100:

$$\beta \propto \frac{1}{N_B W_B}, \quad (3)$$

It should be understood that there may be a clear trade-off between the minimum required charge per unit area in the base layer 100 to block high voltage, and the common emitter current gain in a power BJT. In an example embodiment, the concept of electrostatic shielding of the base layer 215, such as for a structure shown in FIG. 2J, may imply that the minimum charge in the base layer 215, $qN_B W_B$, may not have to be determined by equation (1). In an example embodiment, this may be accomplished by forming blocking junction not with the base layer 215, but with the implanted regions in the bottom surface 224A of the trench 270 (i.e. region 224B) and on the side-walls 251A of the trench 270 (i.e. region 251B). The base layer 215 may be electrostatically shielded from high-field region by a pinched-off JFET like structure, formed by adjacent side-wall implants, such as, a region of the first conductivity type 251B and the channel layer 227. In an example embodiment, the total charge in the base layer 215 may be substantially reduced, providing a much higher value of common emitter current gain according to equation (3) without compromising on device blocking capability.

In an example embodiment, epitaxial re-growth may not be required to fabricate such a device, because electrostatic shielding of the base layer 215, without a "punch-through" breakdown, may be achieved by utilizing ion implanters with energies, for example, below 360 keV and without using, for example, deep MeV ion implantations. In an example embodiment, there may be no MOS interface incorporated into any active device structure, which may eliminate operational reliability in structures such as SiC MOSFET structures. In an example embodiment, a plurality of stacked layers of conductivity of second type may be formed to optimize the emitter-base capacitance instead of a single emitter layer 218. In an example embodiment, the edge termination may be a single or multi-zone junction termination extension (JTE or MJTE), multiple floating guard-rings (MFGR), a bevel, field-plate or deep mesa 278 isolation formed with an additional manufacturing step, or the like, or an appropriate combination thereof.

In an example embodiment, the structure of a TI-BJT 245 may be applied to a thyristor, where the emitter layer 218 becomes the cathode layer, the base layer 215 becomes the gate, and the substrate layer 236 has the conductivity type opposite of the cathode layer and the drift layer 233. The collector layer becomes the anode 282 layer. The opposite polarity device may be implemented by reversing all the layer doping polarities. It should be understood that a collector layer may also be referred to as a collector electrode.

FIGS. 2K-2T illustrate an exemplary method of manufacturing the TI-BJT 245 which is monolithically integrated with a Junction Barrier Schottky (JBS) 248 diode structure.

FIG. 2K illustrates an exemplary embodiment of the initial wafer structure for the TI-BJT 245 with an implanted emitter and base, monolithically integrated with TI-JBS diode 248. FIG. 2K further illustrates a typical original wafer structure, which may comprise the substrate 236 of second conductivity type, drift layer 233 of second conductivity type, and an epitaxially grown channel layer 227 of the second conductivity type. Channel layer 227 may also, for example, serve to form a Schottky contact within a JBS diode 248 region.

Figure 2L:
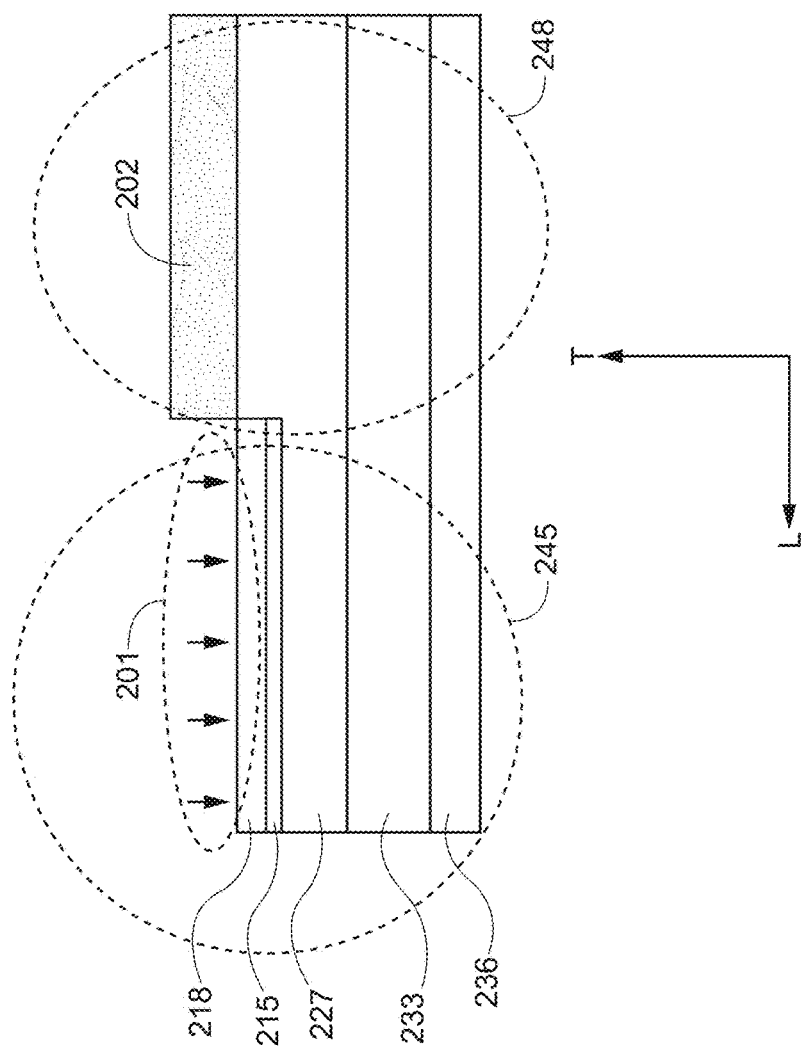

FIG. 2L illustrates an exemplary embodiment of an ion implantation of an emitter layer 218 and a base layer 215 for the TI-BJT 245 with implanted emitter and base, monolithically integrated with JBS diode 248. FIG. 2L illustrates an exemplary ion implantation 201 of first conductivity type for the base layer 215 and second conductivity type for emitter layer 218 into channel layer 227. In an example embodiment, this implantation may be masked using a masking material 202 over the JBS diode 248 region. It should be understood that the masking material 202 may also be referred to as an implantation mask. The masking material 202 may consist of, but is not limited to, photoresist, metal or CVD dielectric materials, and may be thick enough to block the implantation tail from penetrating into semiconductor surface. In an example embodiment, the ion implantation 201 may be performed at a temperature compatible with masking material 202, such as, for example, from room temperature to 1100 degrees Celsius.

Figure 2M:
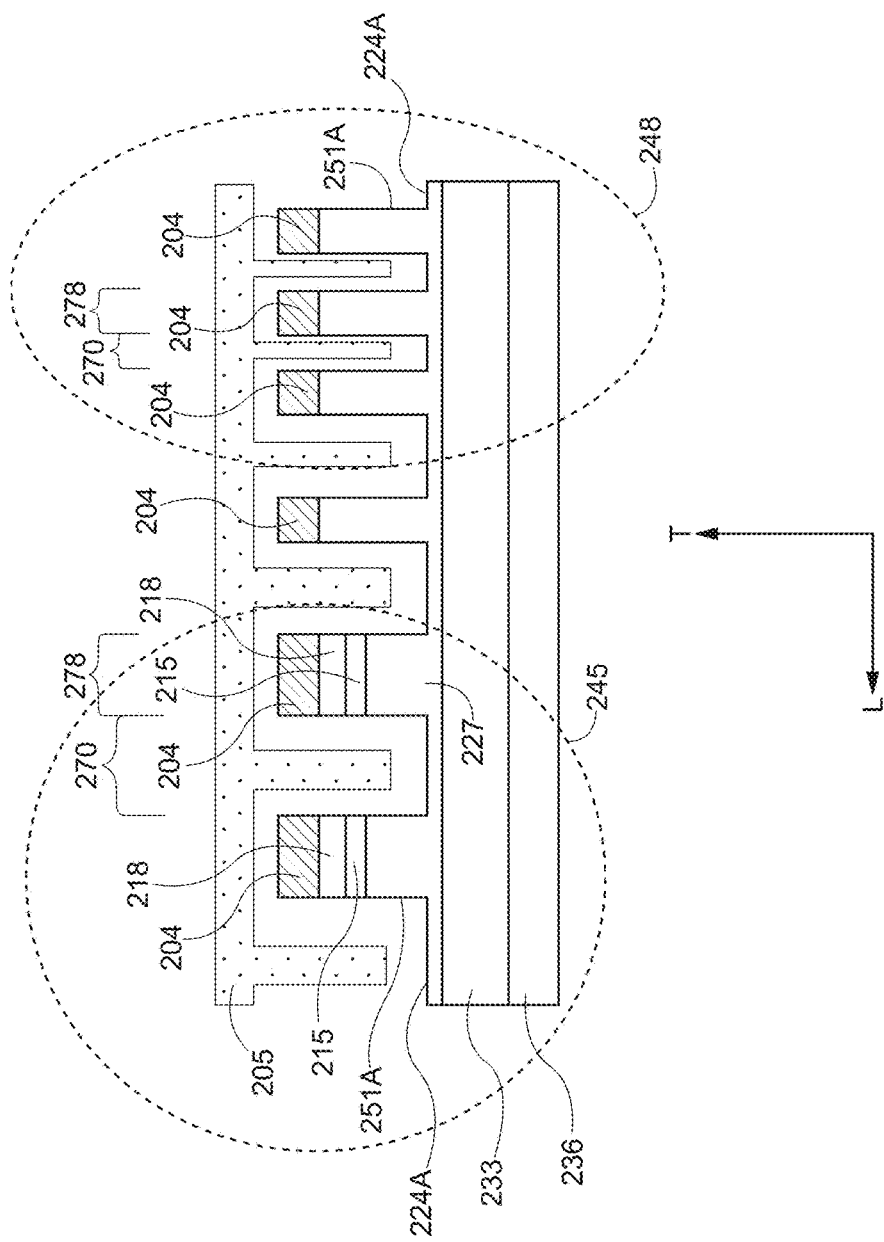

FIG. 2M illustrates an exemplary trench 270 formation with plasma etching 205 for the TI-BJT 245 and JBS diode 248 regions. The plasma etching 205 may penetrate through the emitter layer 218, the base layer 215, and the channel layer 227, and stop within the drift layer 233. Alternatively, the trench 270 may stop within the channel layer 227 in some embodiments. The etching mask 204 may be of a thickness, for example, to withstand plasma etching 205, to block the subsequent ion implantations and to prevent dopant compensation in emitter layer 218.

Figure 2N:
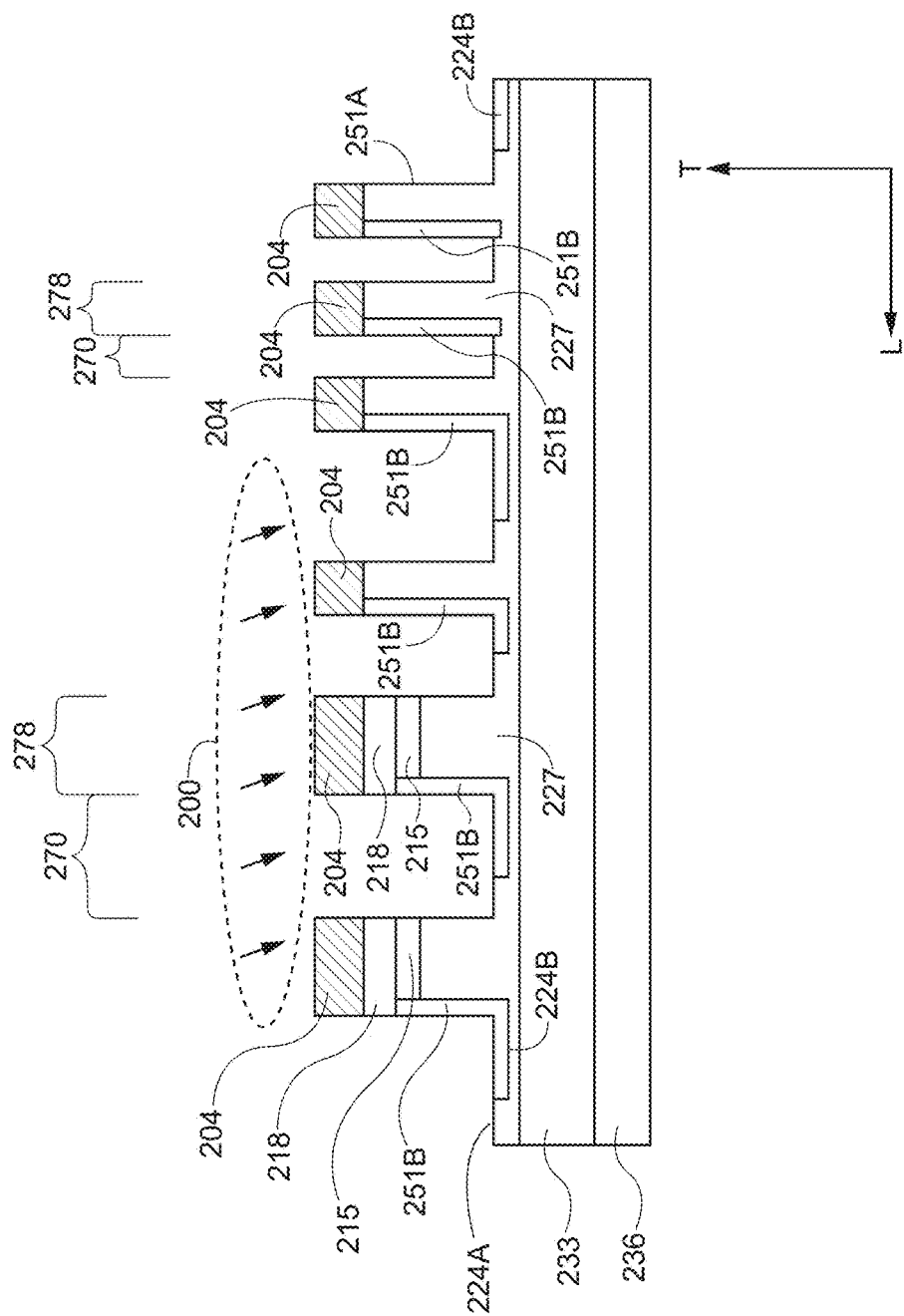

FIG. 2N illustrates an exemplary embodiment of a tilted ion implantation 200 into a side-wall 251A of a trench 270 of the TI-BJT 245 with implanted emitter layer 218 and base layer 215, monolithically integrated with the JBS diode 248. It should be understood that side-walls 251A may refer to side-walls of the mesa 278 as well as side walls of the trench 270. As illustrated in FIG. 2N, the tilted ion implantation 200 of first conductivity type may be performed under non-vertical conditions into one side-wall 251A of a trench 270 and mesa 278 side-wall for both the TI-BJT 245 and JBS diode 248 regions, forming a region of first conductivity type 251B. In an example embodiment, the doping of emitter layer 218 may, for example, be high enough to prevent the thick, heavily doped emitter layer 218 of second conductivity type from being converted to a region of first conductivity type 251B by tilted ion implantation 200.

Figure 2O:
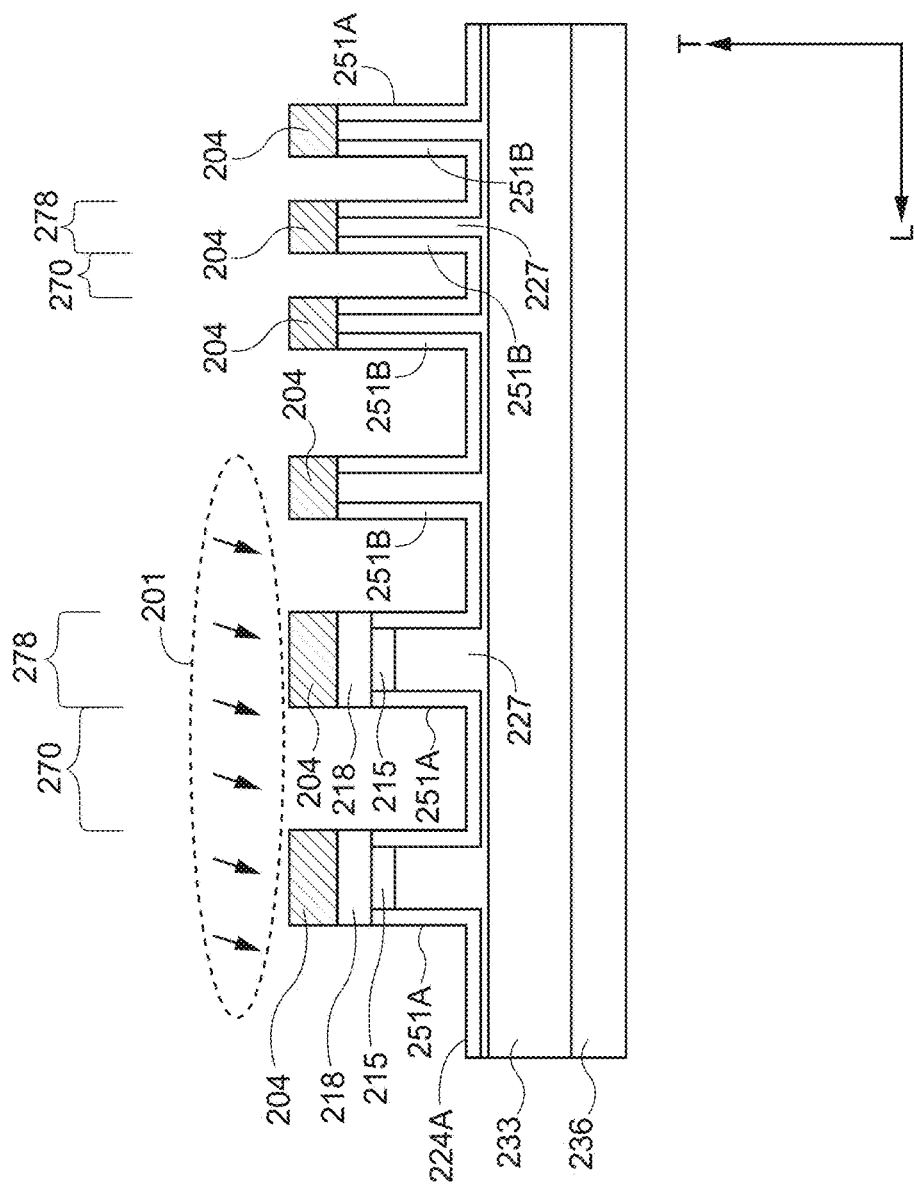

FIG. 2O illustrates an exemplary embodiment of tilted ion implantation 201 into second side-wall of the TI-BJT 245 with implanted emitter layer 218 and base layer 215, monolithically integrated with the JBS diode 248. FIG. 2O further illustrates an exemplary ion implantation 201 of first conductivity type, performed under non-vertical condition into another trench side-wall 251A for TI-BJT 245 and JBS diode 248 regions. In an example embodiment, this may form a region of first conductivity type 251B. These implants may not necessarily cover the bottom surface 224A of the trench 270.

Figure 2P:
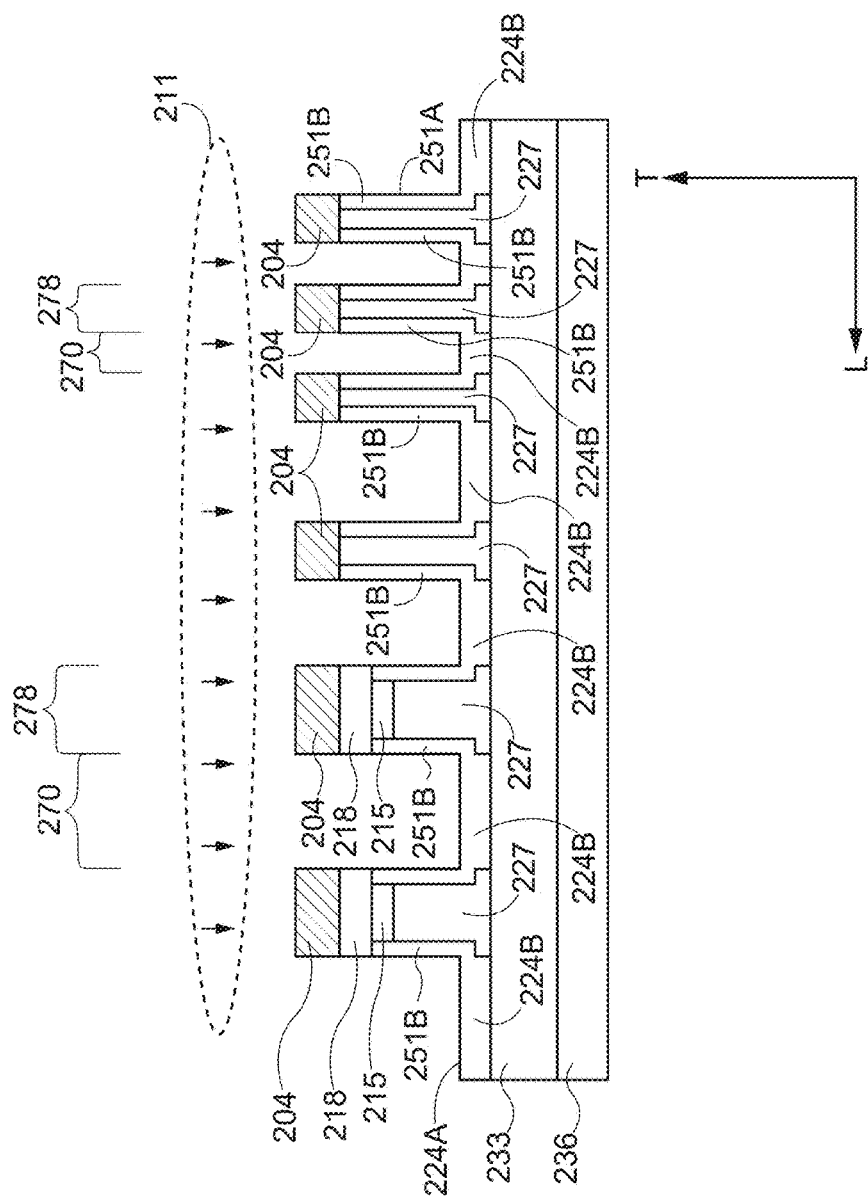

FIG. 2P illustrates an exemplary embodiment of the vertical ion implantation 211 of first conductivity type, performed under vertical angle, to form the region of first conductivity type 224B at the bottom surface 224A of the trench 270 for the TI-BJT 245 and JBS diode 248 regions. In an example embodiment, the vertical ion implantation 211 may have a high surface concentration for basic ohmic contact formation, and may be deep enough to form a blocking junction that does not deplete completely when the device is in its blocking mode. Additionally, the vertical ion implantation 211 may be further activated, for example, through a high-temperature annealing process. In an example embodiment, this may consist of a thermal anneal process in a furnace, or a laser-annealing process, or the like, or an appropriate combination thereof.

Figure 2Q:
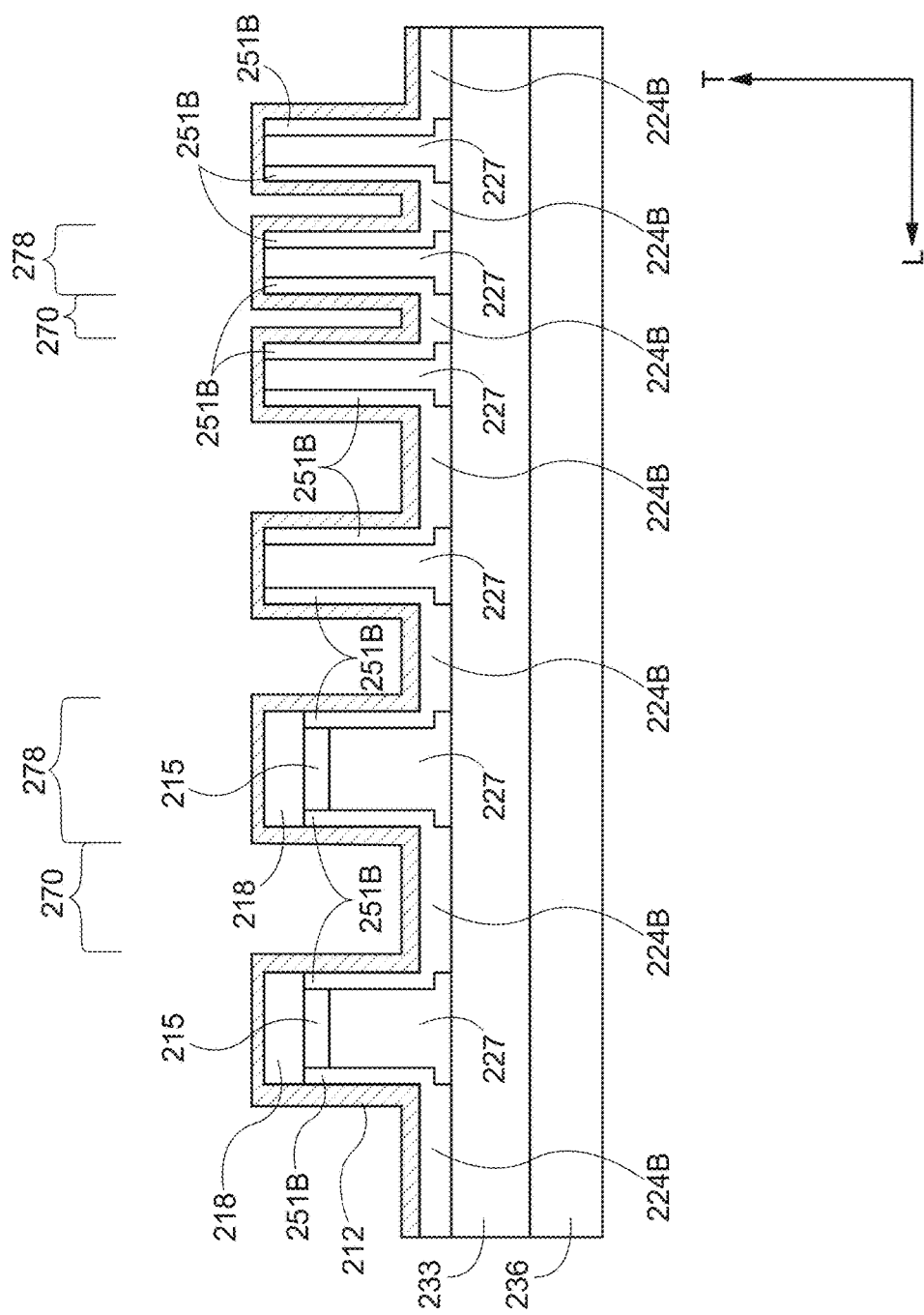

FIG. 2Q illustrates an exemplary embodiment of surface passivation for the TI-BJT 245 with implanted emitter layer 218 and base layer 215, monolithically integrated with a JBS diode 248. As illustrated in FIG. 2Q, a surface passivation layer 212 may be formed. In an example embodiment, surface passivation may eliminate surface leakage paths between the base layer 215 and emitter layer 218, as well as between base layer 215 and anode 282 of the diode, and may also protect device edge termination.

Figure 2R:
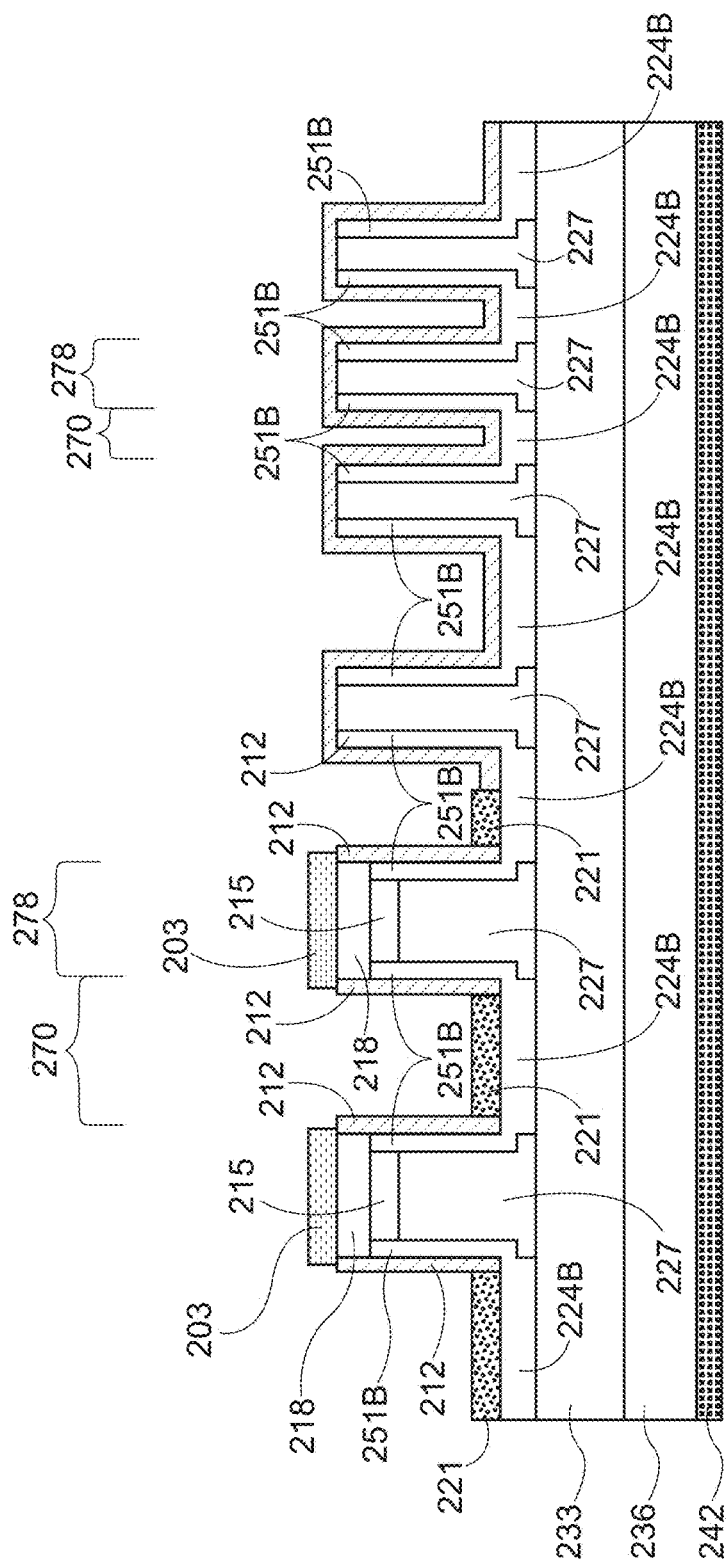

FIG. 2R illustrates an exemplary embodiment of the formation of the emitter ohmic contacts 203, base ohmic contacts 221 and collector ohmic contacts 242 in the TI-BJT 245 region. A masked etch of the surface passivation layer 212, for example, may form gaps in the TI-BJT 245 region, while protecting the top surface of the JBS diode 248 region.

In an example embodiment, a metal, for example, Nickel, may then be deposited in these gaps and annealed to form the contact regions such as emitter ohmic contacts 203 and base ohmic contacts 221. The excess metal may then be chemically removed. In this manner, self-aligned contact regions, such as, for example, the emitter ohmic contacts 203 and base ohmic contacts 221 may be formed, with no metal remaining in the JBS diode 248 region.

Figure 2S:
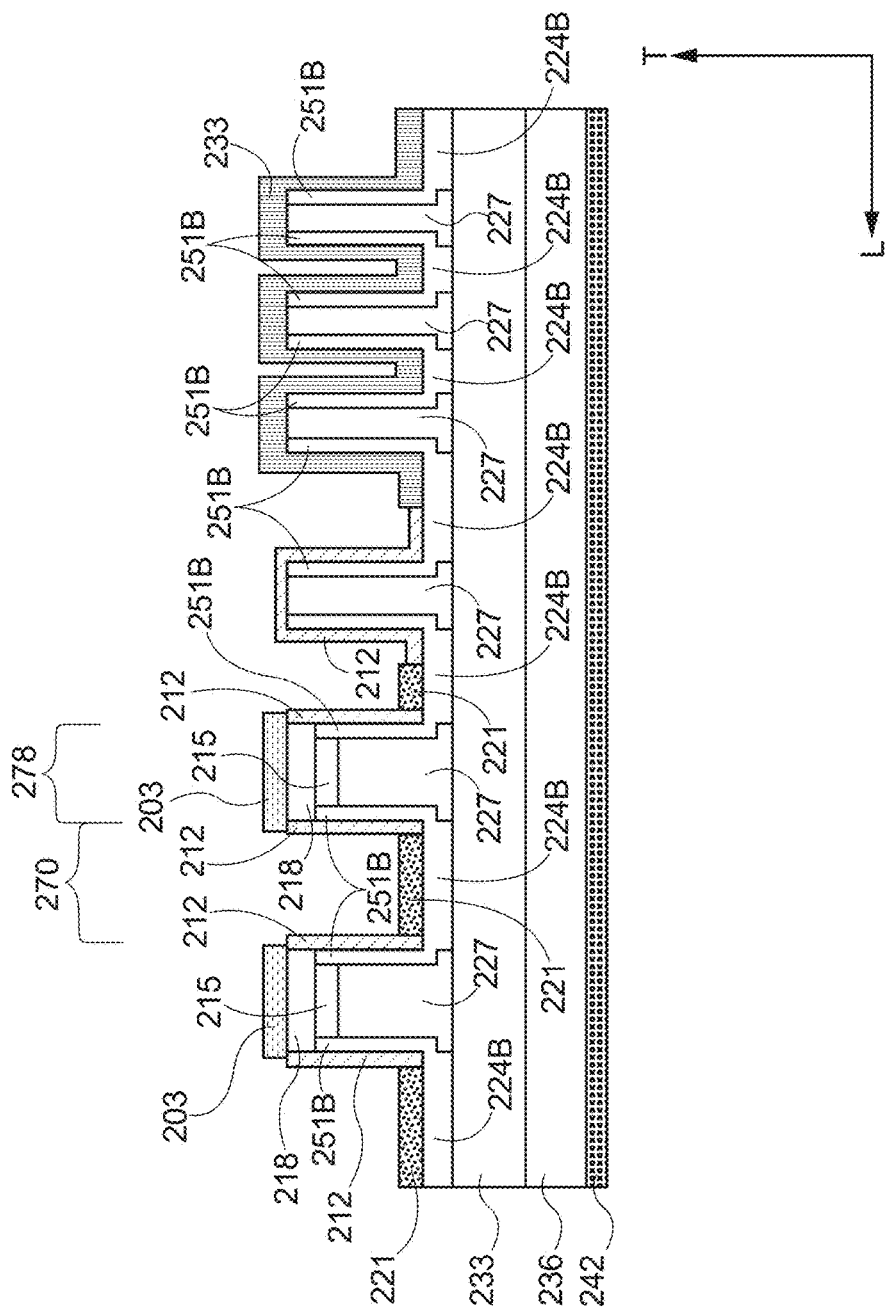

FIG. 2S illustrates the formation of the anode contact 282 of the JBS diode 248. A mask may be used to protect the TI-BJT 245 region, allowing removal of the surface passivation 212 selectively from the JBS diode 248. This removed portions may then be contacted by the Schottky metal 282 using processes, such as, for example, lift-off. It should be understood that Schottky metal may also be referred to as a Schottky contact or an anode contact.

Figure 2T:
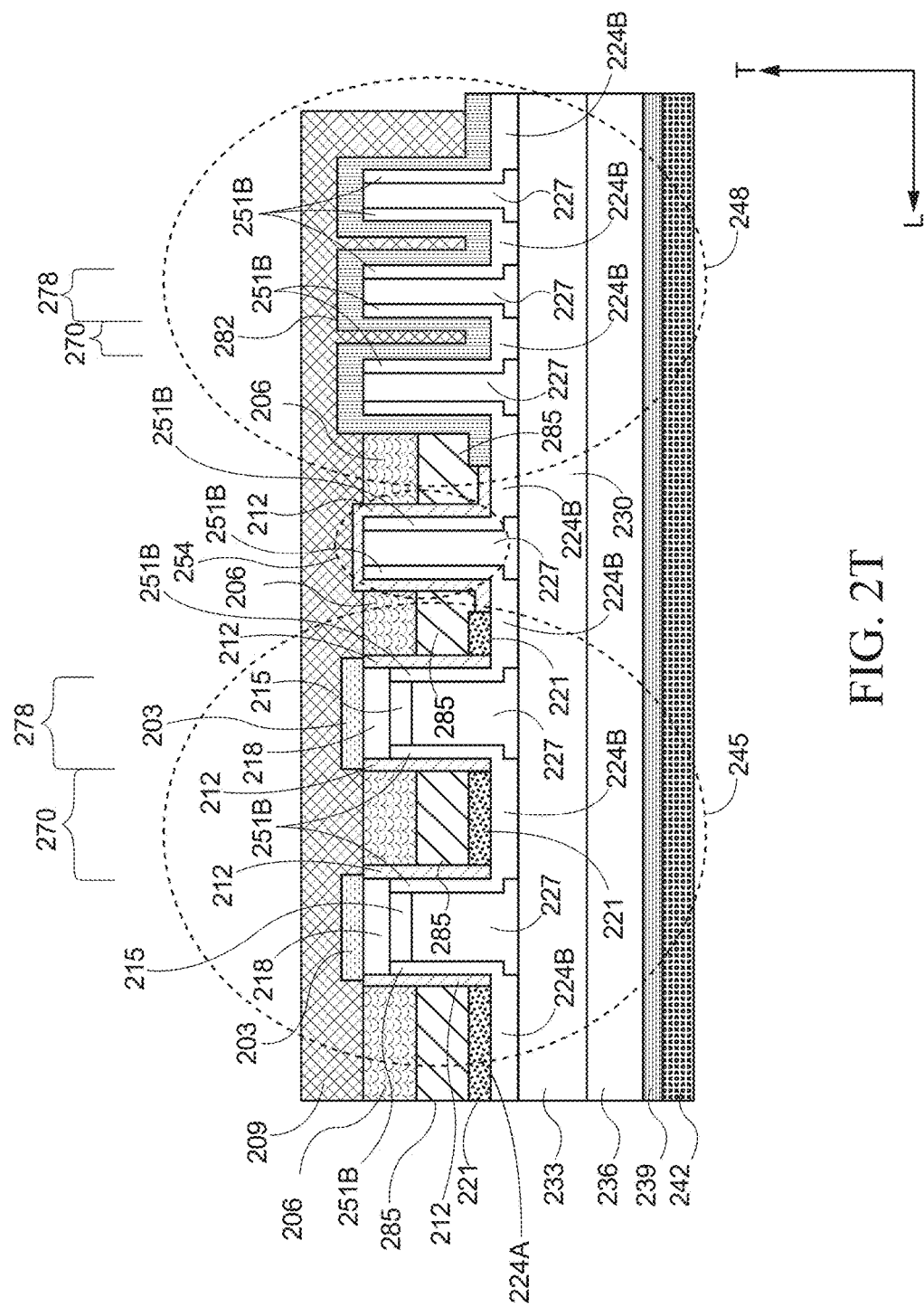
FIG. 2T illustrates a cross-sectional view of another exemplary embodiment of a fabricated TI-BJT with implanted emitter and base, monolithically integrated with trenched-and-implanted JBS diode.

FIG. 2T illustrates a unit cell of the TI-BJT 245. TI-BJT 245, as well as other embodiments of the present invention, may contain layers and regions of a first conductivity type and a second conductivity type. FIG. 2T illustrates an exemplary schematic cross-sectional view of a device after the base contact overlay 285, interlayer dielectric 206 and collector overlay 242 are formed. In an embodiment illustrated in FIG. 2T, JBS diode 248 may be understood to be a trenched and implanted diode. The device structure may comprise TI-BJT 245 and a JBS diode 248. As illustrated in FIG. 2T, the top overlay 209 may connect emitter ohmic contacts 203 of a TI-BJT with anode contact 282 of JBS diode 248. In an example embodiment, emitter metallization may also connect the collector and cathode on the wafer backside 242. As further illustrated in FIG. 2T, the electrically inactive region 254 may provide electrical isolation between the base ohmic contacts 221 of TI-BJT 245 and the emitter ohmic contacts 203 or between the base ohmic contacts 221 of TI-BJT 245 and the anode contact 282 of JBS diode 248. The isolation region 254 may, for example, consist of multiple trenches and unimplanted regions to increase voltage blocking capability between the base layer 215 of the TI-BJT 245 and anode contact 282 of JBS diode 248. In an example embodiment, the electrically inactive region 254 may comprise two back-to-back pn junctions. The width of the region may be of a narrow thickness to prevent field crowding in blocking mode and to support potential differences between the base ohmic contact 221 of the TI-BJT 245 and the emitter layer 218. The trench 270 of the TI-BJT 245 may comprise, for example, an base layer 215 of first conductivity type in direct interface with emitter layer 218, where electrostatic shielding provided by implanted regions 251 of second conductivity type.

In an example embodiment, the trench geometry may provide versatility in the device design. A thin implanted layer of first conductivity type 251B may be formed on the side-walls 251A of mesa 278 with low-energy ion implanters. For example, this may result in a low-cost manufacturing process. In an example embodiment, the blocking junction may be provided by implanted regions of first conductivity type, such as the bottom surface 224A of the trench 270. The doping and geometry of the channel layer 227 of second conductivity type may then be separately optimized depending on the widths of the mesa 278. Bottom surface 224A of the trench 270 may provide a blocking junction and high-voltage capability. In an example embodiment, the side-wall 251A implanted regions, such as a region of the first conductivity type 251B may provide electrical connection to the base layer 215 and an electrostatic shielding effect of the base layer 215 in the blocking mode. In an example embodiment, the thickness of the base layer 215 and the emitter layer 218, for example, may be 0.2 um and 0.25 um respectively. The base layer 215 and the emitter layer 218 may also be implanted with ion implanters with required energies, such as, for example under 360 keV for the base 215 and 60 KeV for the emitter 218. This may provide a method of uniform doping control of the base layer 215 through ion implantation instead of epitaxial growth, which in turn results in a uniform and reproducible common emitter current gain of the TI-BJT 245. In an example embodiment, the JBS diode 248 may provide a built-in antiparallel diode for switching applications, for example, in the H-bridge configuration. The width of the JBS diode 248 trenches 270 may be optimized to block the same voltage as the BJT and to provide forward current handling capability. In an example embodiment, the anode contact 282 may be formed on, for example, an un-etched and un-implanted virgin semiconductor surface, which may lead to lower device leakage levels. In another example embodiment, the shielding of the JBS diode 248 surface by the implanted regions, such as layer of first conductivity type, may also allow design of a lower forward voltage drop for a given level of blocking mode leakage current. In an example embodiment, monolithic integration may provide savings in the amount of device active area used. In an example embodiment, savings in chip size may become considerable at higher device voltage ratings, where a very wide edge termination may be needed for both transistor and diode.

FIG. 2T illustrates an example embodiment that comprises a base layer 215 of a TI-BJT 245 region confined between two side-walls of the etched emitter mesa 278, where the side-walls 251A are implanted with layers of first conductivity type 251B as the base, which form an electrical connection to the base ohmic contact 221. In an example embodiment, the trench geometry may provide great versatility for optimizing the common emitter current gain, forward current, and device blocking voltage. Additionally, the width of the base 215 may be thin to provide a higher value of common emitter current gain so it does not have to support high voltage in blocking mode. The base layer 215, for example, may be electrostatically shielded with a pinched-off JFET like structure described in, for example, FIGS. 2J and 2T, when a reverse bias is applied between the base layer 215 and collector of the TI-BJT 245. In an example embodiment, epitaxial re-growth may not be required to fabricate such a device. For example, efficient electrostatic shielding of the base layer 215, without a "punch-through" breakdown, may be achieved by utilizing tilted ion implants into side-walls 251A of the trench 270 with energies, for example, below 360 keV and without needing, for example, deep MeV ion implantations were they to be done vertically as in the prior art.

FIGS. 3-5 illustrate exemplary embodiments of manufacturing the TI-BJT 245 in accordance with the present invention.

In an example embodiment, monolithic integration of the TI-BJT and JBS diode 248 may be manufactured with implanted emitter layer 218, base layer 215, and channel layer 227 of the trench TI-BJT 245, and a JBS diode 248 formed on unetched virgin epitaxial surface of the drift layer. FIG. 3A illustrates an example embodiment of an initial wafer structure for the TI-BJT 245 with implanted emitter layer 218, base layer 215, and channel layer 227, monolithically integrated with a planar non-etched JBS diode 248. As FIG. 3A illustrates, the initial wafer structure may comprise the substrate 236 of second conductivity type and drift layer 233 of second conductivity type.

Figure 3C:
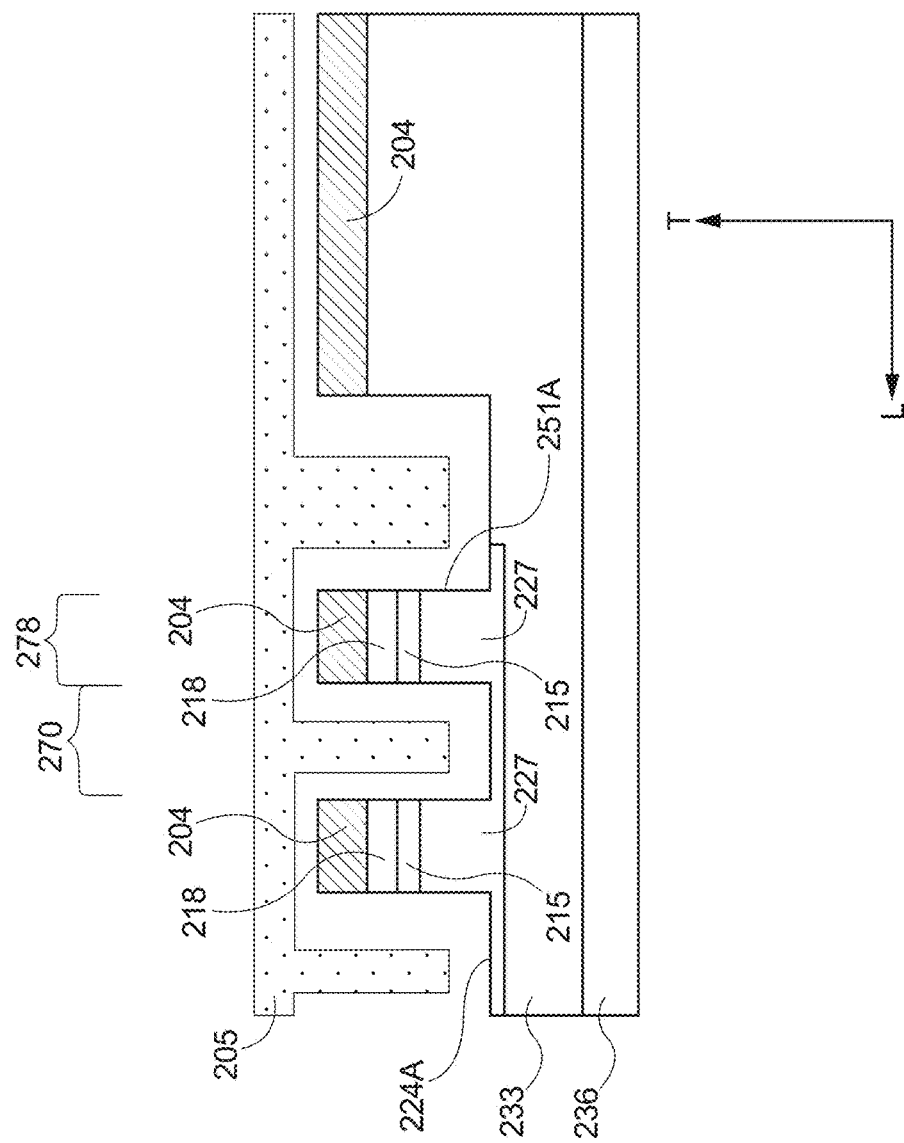

FIG. 3B illustrates an exemplary embodiment of the TI-BJT 245 with implanted emitter layer 218, base layer 215, and channel layer 227, monolithically integrated with planar non-etched JBS diode 248. FIG. 3B illustrates the combined ion implantation 213 for emitter layer 218, base layer 215 and the channel layer 227 for the TI-BJT 245. FIG. 3C illustrates the trench 270 formation within the TI-BJT 245 with implanted emitter layer 218, base layer 215, and channel layer 227, monolithically integrated with planar non-etched JBS diode 248, where the JBS diode 248 region, for example, may be unetched.

Figure 3D:
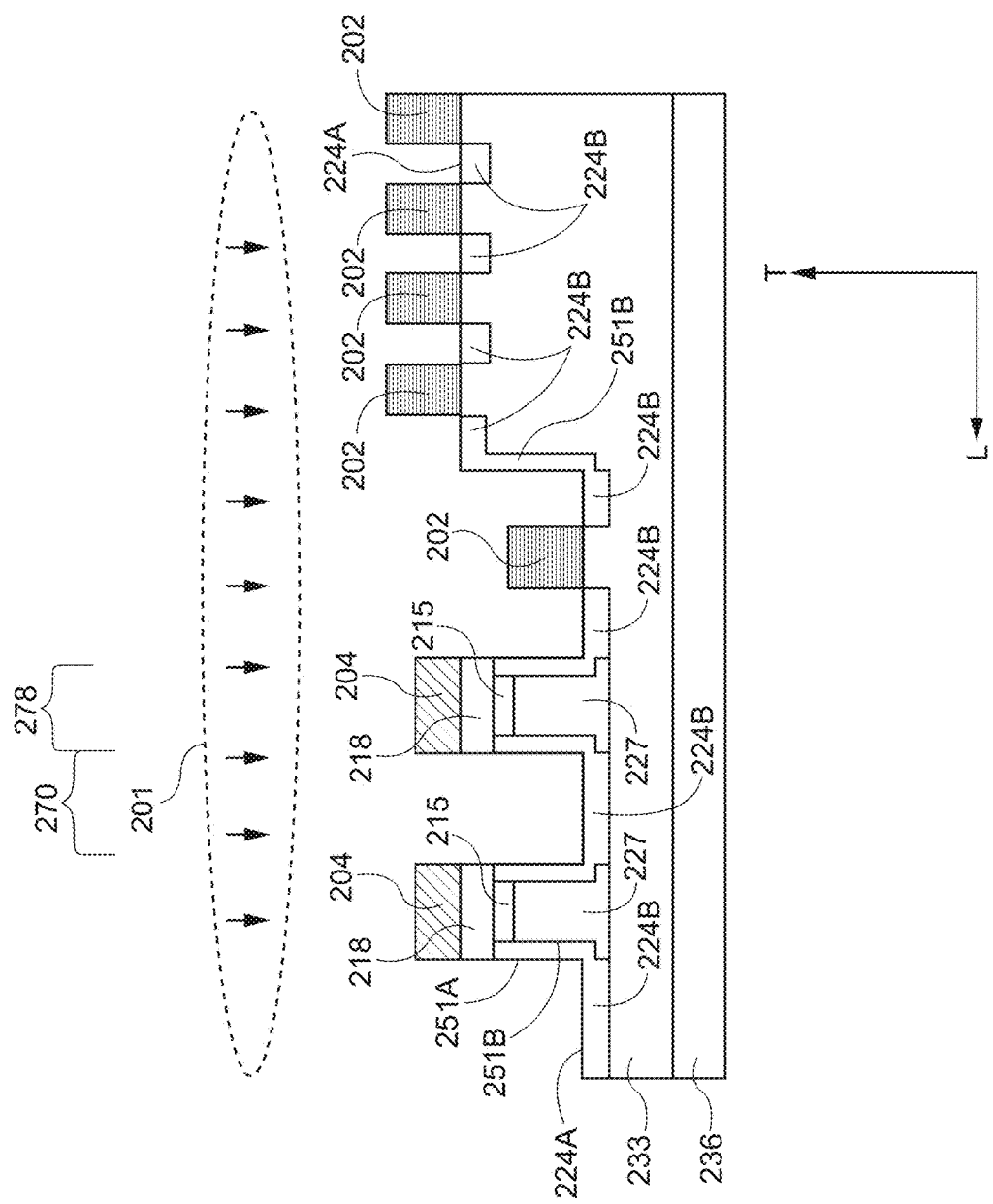

FIG. 3D illustrates an example embodiment of the vertical ion implantation of the first conductivity type 201 of the TI-BJT 245. FIG. 3D further illustrates vertical ion implantation 201 into the active area of the planar non-etched JBS diode 248. In an example embodiment, in addition to the etching and etching mask 204 for the TI-BJT 245 active area, an additional masking material 202 may be formed to protect, for example, the Schottky regions of the JBS diode 248 from ion implantation, such as, for example, ion implantation 201.

Figure 3E:
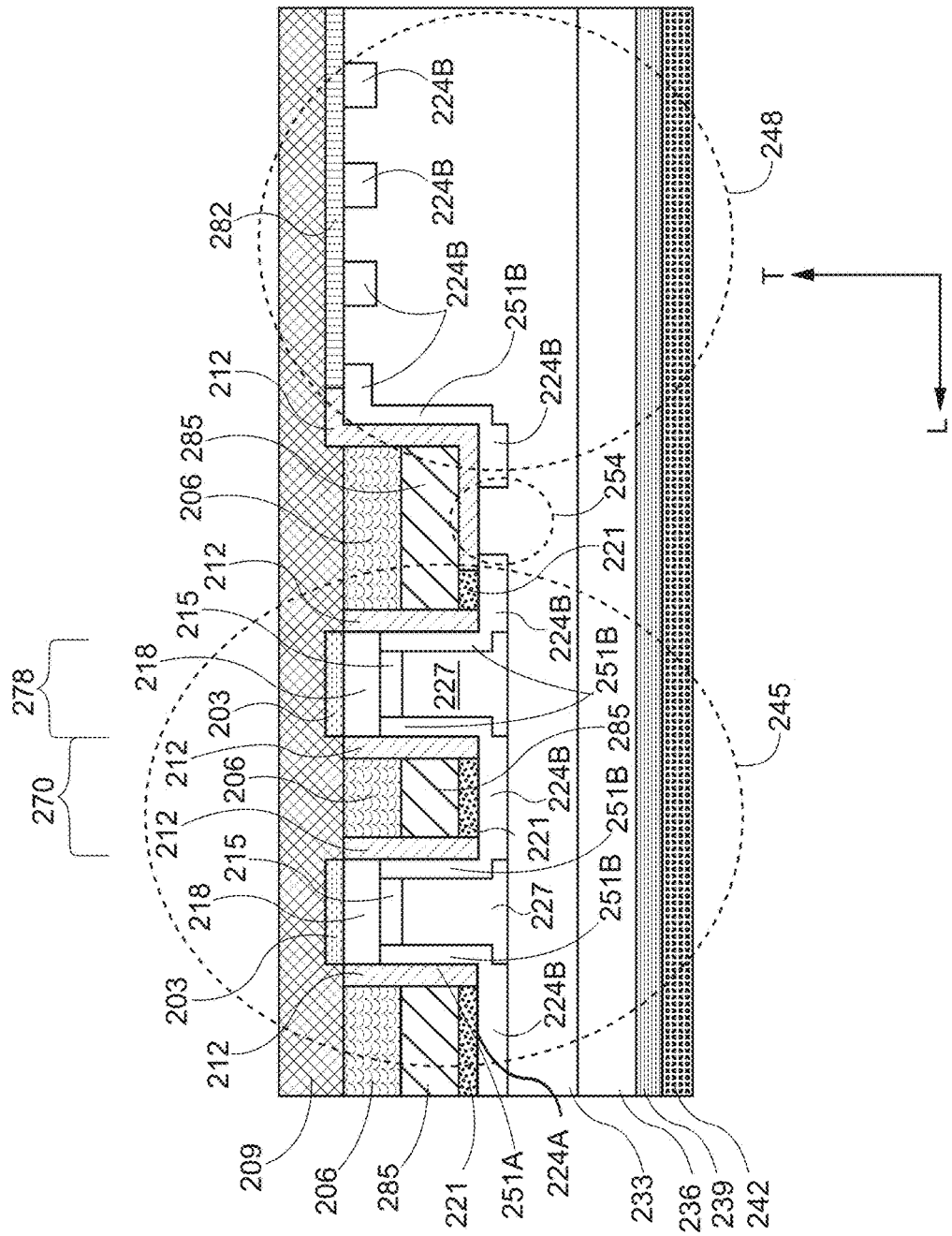
Figure 3F:
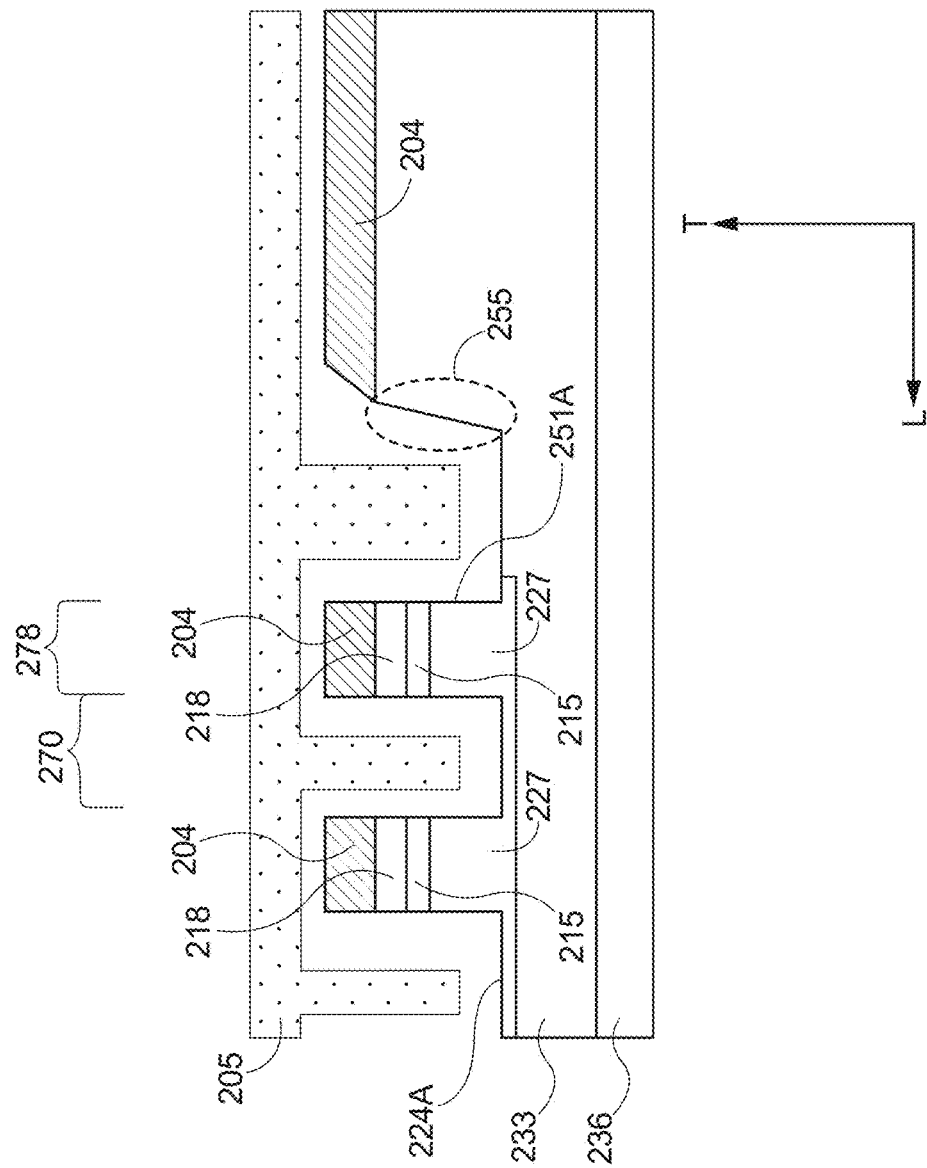
Figure 3G:
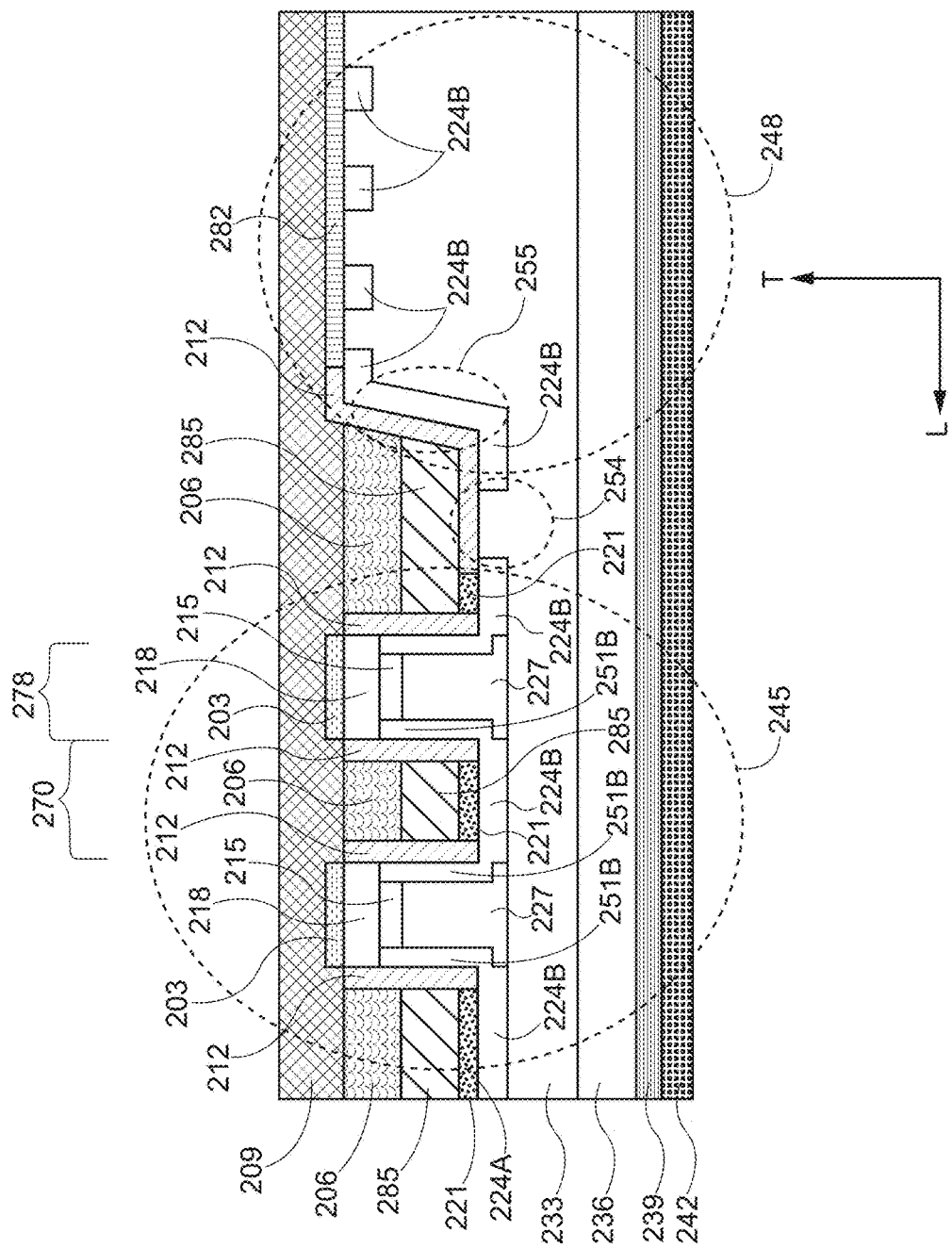
FIG. 3G illustrates a cross-sectional view of another exemplary embodiment of a fabricated TI-BJT with implanted emitter, base, and channel layer, monolithically integrated with planar non-etched JBS diode with a beveled side-wall.

FIG. 3E illustrates a cross-sectional view of a fabricated TI-BJT 245 with implanted emitter layer 218, base layer 215, and channel layer 227, monolithically integrated with a planar non-etched JBS diode 248. The challenge to this approach, for example, might be that deep ion implantation may be required for the channel layer 227 of the trench TI-BJT 245. In an example embodiment, this approach may provide, for example, uniform doping control in emitter layer 218, base layer 215, and channel layer 227 across the entire wafer. In order to minimize field crowding at the lower right corner of the trench 270 formed between the JBS diode 248 and TI-BJT 245, a bevel 255, for example, may be implemented. As illustrated in FIGS. 3F and 3G, the bevel 255 is an implanted sidewall with a sloped transition from the plane of the bottom surface 224A of the trench 270 to the semiconductor top surface. In an example embodiment, the bevel 255 region may be formed with techniques, such as, using an intentionally sloped side-wall of an etching mask 204, and utilizing the difference in plasma etching 205 rates of semiconductor material and the etching mask 204. In an exemplary embodiment, bevel 255 may be an angle in the range of 3 to 89 degrees with the bottom surface 224A. Stated differently, bevel 255 may extend in the longitudinal direction L and the transverse direction T from the bottom surface 224A towards the top surface of the region 248

As illustrated in FIG. 3G, in an example embodiment, monolithic integration of a TI-BJT 245 with a fast unipolar antiparallel diode, such as diode 248, may be accomplished by fabrication process of both a TI-BJT 245 and a diode 248 on the same chip, where the anode 282 of the antiparallel diode 248 shares the same overlay 209 metallization with the emitter ohmic contacts 203 of a TI-BJT 245. Additionally, the wafer backside contact 239 may naturally serve as a cathode of a diode shared with a collector of the TI-BJT 245. For example, the edge termination may be formed together with regions of first conductivity type, such as, region 224B in the bottom surface 224A of the trench 270 or region of the first conductivity type 251B in the side wall(s) 251A either in a form of multiple floating guard-rings, or JTE. In an example embodiment, the diode may be a Schottky, PiN, JBS JBS diode, or MPS (merged PiN and Schottky), or the like, or any appropriate combination thereof.

In an example embodiment, the entire structure may be manufactured based on a drift 233 layer of second conductivity type, without epitaxially grown base layer 215 and emitter layer 218. In the example embodiment, the life-time enhancement may be implemented for very thick drift layers 233 in Silicon Carbide through high-temperature oxidation and subsequent annealing processes. The structure, for example, may also be manufactured on a zero degree off-cut wafer to fully eliminate basal-plane defects in case of Silicon Carbide. For example, the resulting step bunching and surface roughness may be polished off, and N++ emitter layer 218 of the second conductivity type and a base layer 215 of the first conductivity type may then be co-implanted. For example, this process may be useful for Silicon Carbide transistors with over 15 kiloVolt ratings, where the life time may not be long enough to provide efficient conductivity modulation in the drift layer 233. For example, consumption of the surface layer through life-time enhancement and polishing may be negligible compared to the thickness of the drift layer 233. In an example embodiment, the thickness of the drift layer 233, may be, for example, over 120 μm in silicon carbide for >15 kV blocking voltage.

Figure 4A:
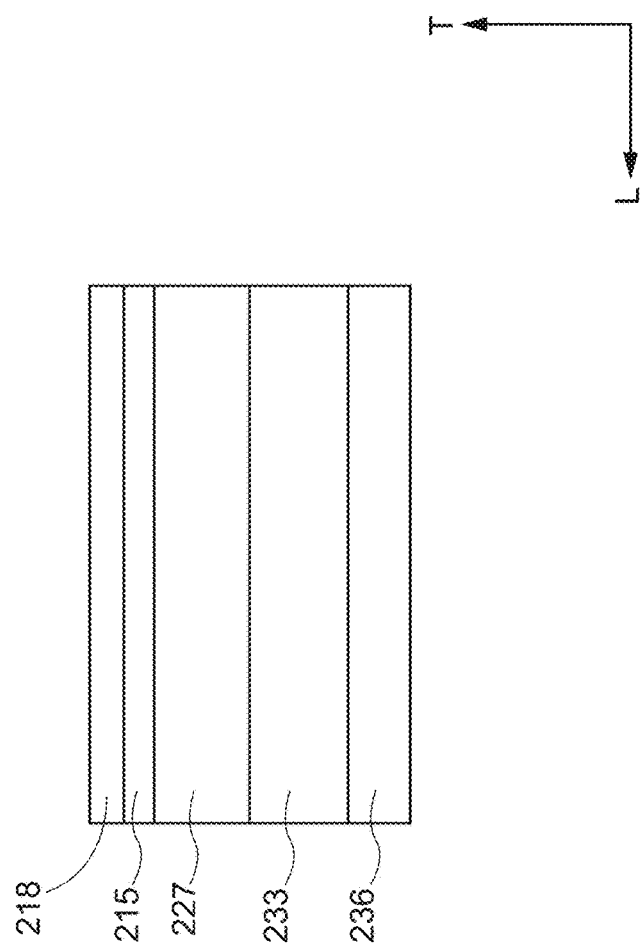
FIGS. 4A-4C illustrate a cross-sectional view of an exemplary method of manufacturing all-epitaxial TI-BJT with implanted emitter and base, monolithically integrated with trenched-and-implanted JBS diode.

In an example embodiment, a TI-BJT 245 may be epitaxially grown. FIG. 4A illustrates an initial wafer structure for all-epitaxial monolithically integrated TI-BJT 245 and JBS diode 248. As illustrated by FIG. 4A, the original wafer structure may comprise the substrate 236 of second conductivity type, drift layer 233 of second conductivity type, and an epitaxially grown channel layer 227 of the second conductivity type. In one example embodiment, the base layer 215 and emitter layer 218 may also be epitaxially grown and instead of being implanted.

Figure 4B:
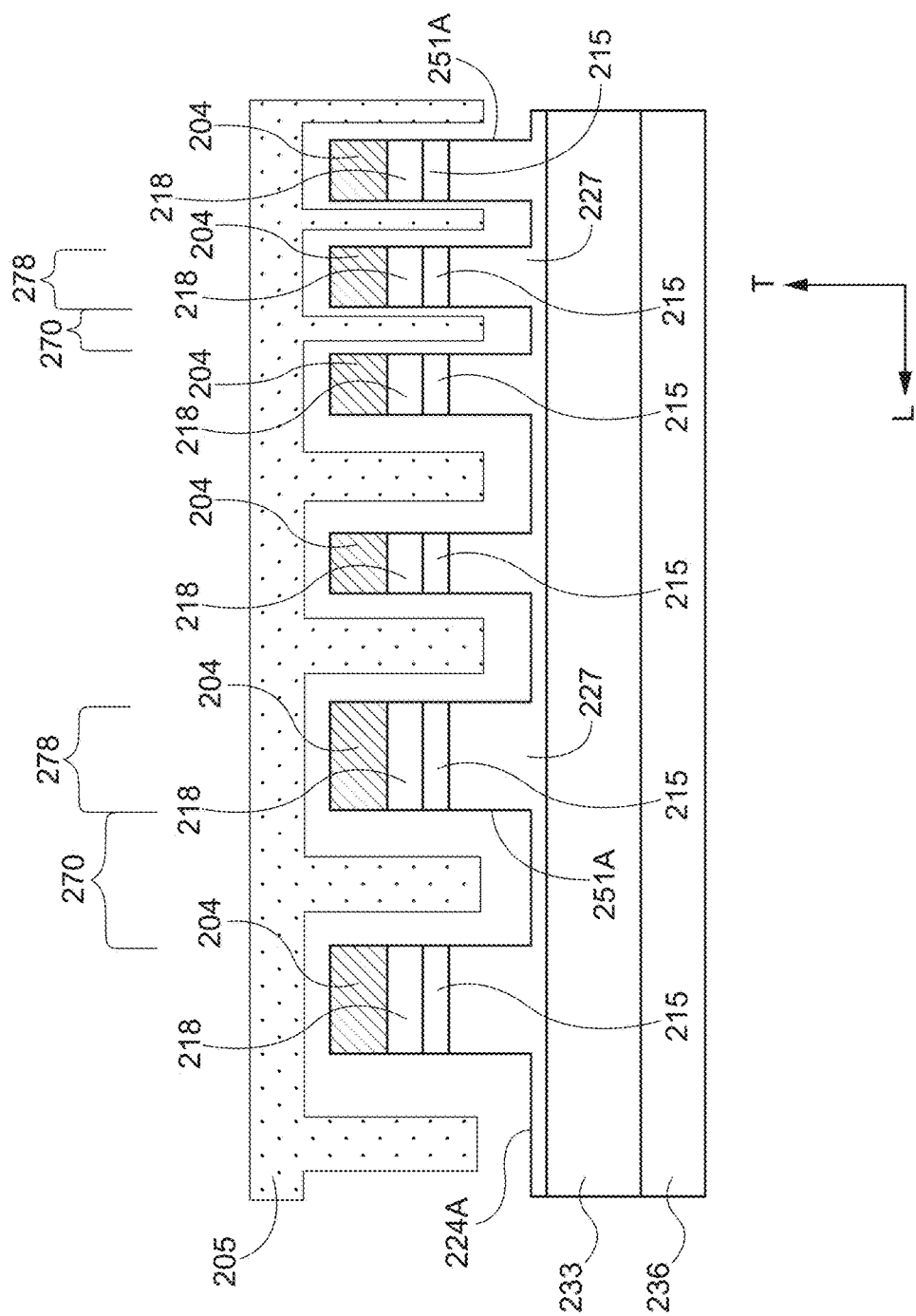

FIG. 4B illustrates trench formation for all-epitaxial monolithically integrated TI-BJT 245 and JBS diode 248 diode. As illustrated in FIG. 4B, the plasma etching 205 may penetrate through emitter layer 218, base layer 215, and partly or fully through channel layer 227, and may stop within drift layer 233. In contrast to the process illustrated in FIG. 2, the mesa 278 tops in JBS diode 248 region may have a heavier doped region 218 of second conductivity type and layer 215 of first conductivity type. In an example embodiment, these layers may have to be subsequently removed from the mesa 278 tops of JBS diode 248. The etching mask 204 may be of a thickness to withstand plasma etching 205 and to block the subsequent ion implantations. This may prevent undesirable dopant compensation in the emitter layer 218.

Figure 4C:
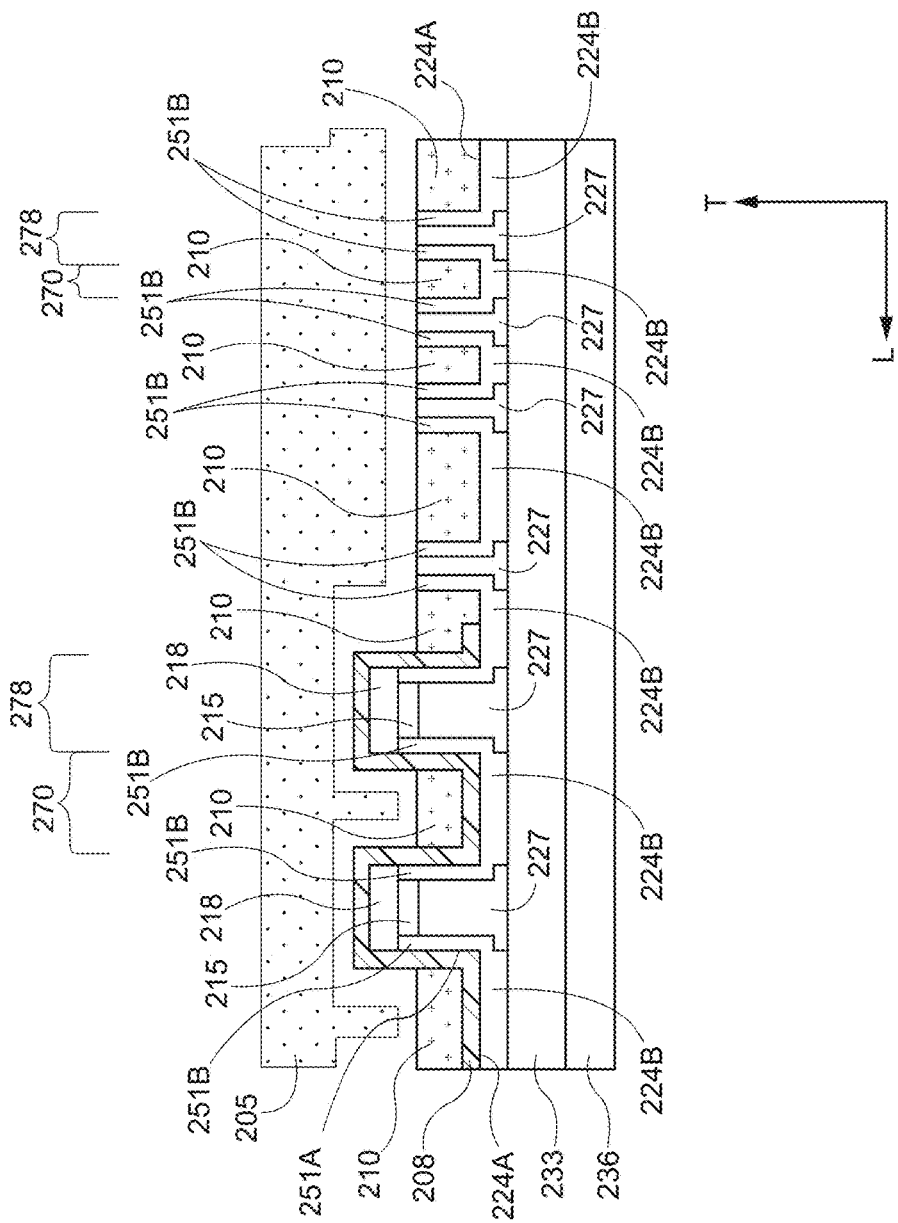

FIG. 4C illustrates an example embodiment of selective etching of top epitaxial layers in the diode 248 region for the all-epitaxial TI-BJT 245, monolithically integrated with trenched-and-implanted JBS diode 248. As illustrated in FIG. 4C, the TI-BJT 245 may comprise selective plasma etching 205 of top epitaxial layers, such as the base layer 215 and emitter layer 218 in diode region 248, stopping within the channel layer 227. To accomplish this, FIG. 4C shows the implementation of a dual masking step, wherein layer 208 is first deposited and then removed from the diode area 248. Thereafter, a second layer 210 is deposited and etched back to expose the mesa 278 tops in the diode area 248. The mask layers may be selected to provide good selectivity over the semiconductor during etching, e.g., Nickel. In an example embodiment, the mesa 278 region in the TI-JBS diode area 248 may then be etched to remove the emitter layer 218 and base epi layers 215 and exposing the channel layer 227 surface for Schottky formation in a subsequent step. In another example embodiment, the rest of the steps to manufacture the fabrication of the TI-BJT 245 may be similar to the steps to manufacture the fabrication of the TI-BJT 245 described in FIG. 2.

Figure 4D:
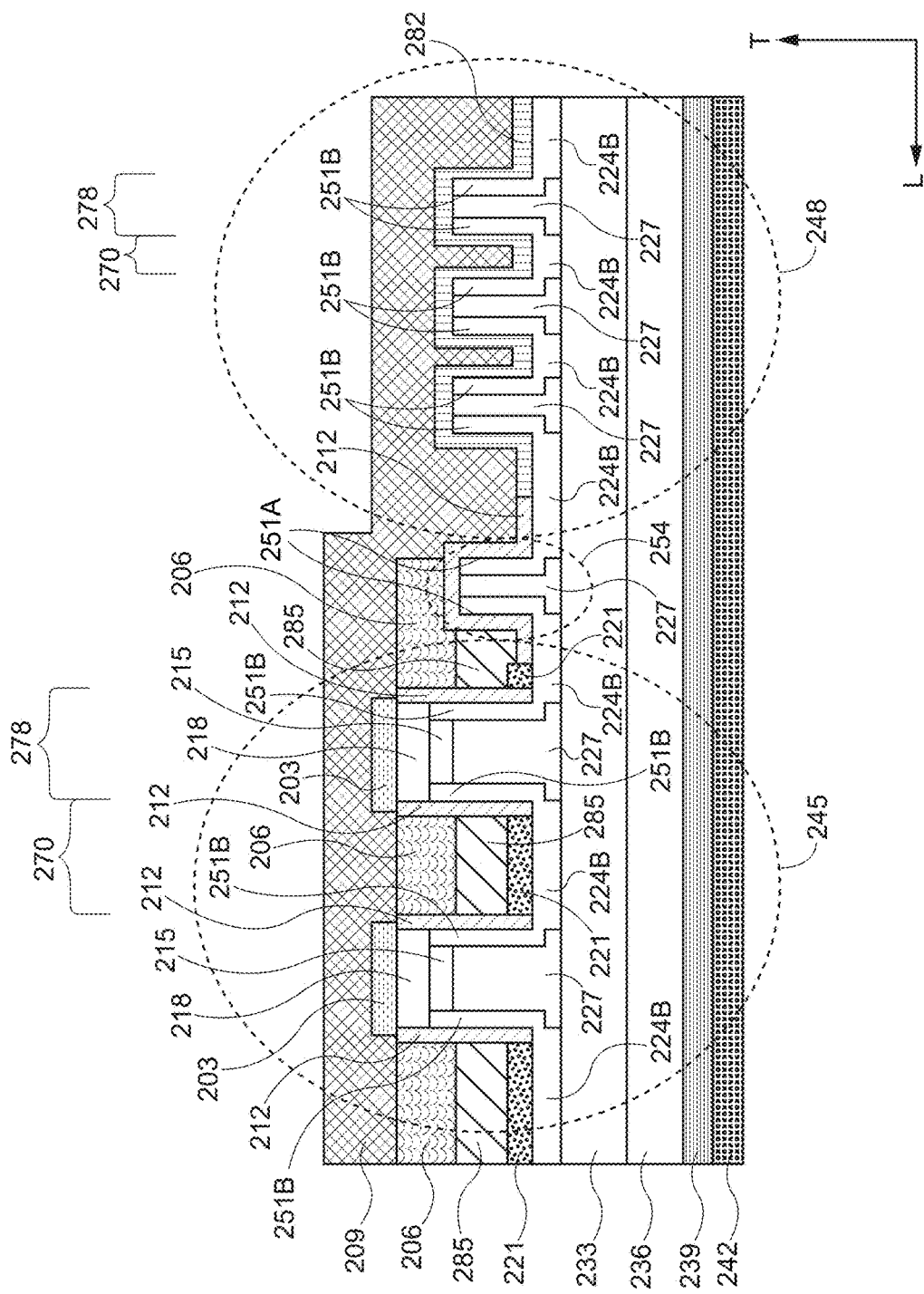
FIG. 4D illustrates a cross-sectional view of another exemplary embodiment of a fabricated all-epitaxial TI-BJT, monolithically integrated with trenched-and-implanted JBS diode.

FIG. 4D illustrates an example embodiment of a cross-sectional view of a fabricated all-epitaxial TI-BJT 245, monolithically integrated with JBS diode 248. It should be understood that a JBS diode 248 may also be referred to as a TI-JBS diode. As illustrated in FIG. 4D and in contrast to the process described in FIG. 2T, the anode contact 282 of the JBS diode 248 may be formed on the surface, where the base layer 215 and the emitter layer 218 were etched.

Figure 5A:
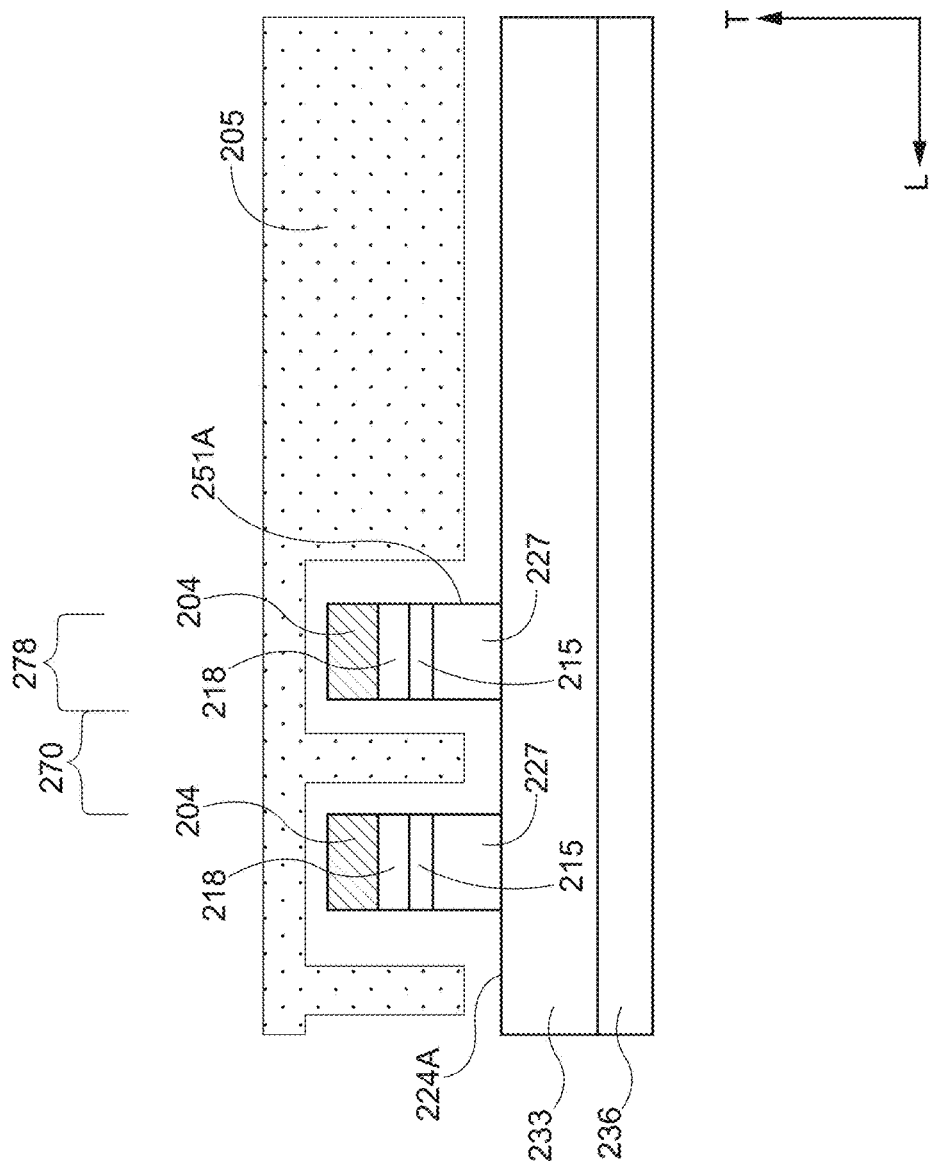
FIGS. 5A-5B illustrate a cross-sectional view of an exemplary method of manufacturing an all-epitaxial monolithically integrated TI-BJT and planar-etched JBS diode.

FIG. 5A illustrates an example embodiment of a trench 270 formation for an all-epitaxial monolithically integrated TI-BJT 245 and planar-etched JBS diode 248. Another example embodiment of a monolithic integration of TI-BJT 245 and JBS diode 248 may be accomplished with the same wafer structure as illustrated in FIG. 4A. For example, JBS diode 248 may be formed on a single plane without trenches 270 by planar etching of the entire JBS diode 248 region by, for example, plasma etching. As illustrated in FIG. 5A, the TI-BJT 245 may include, selective plasma etching 205 of the top epitaxial layers, such as the base layer 215, emitter layer 218 and the channel layer 227, and stopping within drift layer 233.

Figure 5B:
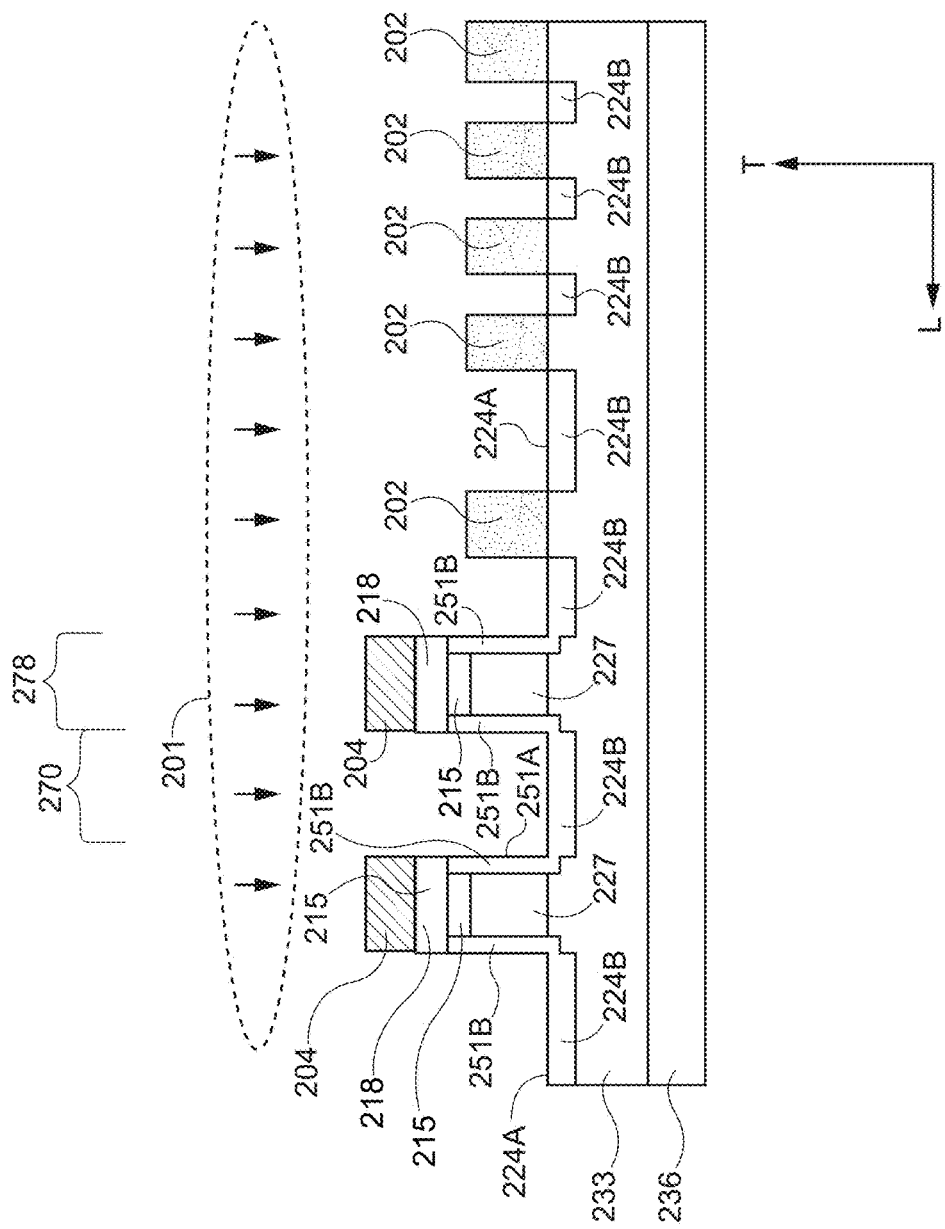

FIG. 5B illustrates the ion implantation 205 of first conductivity type 205 into the blocking pn-junction bottom surface 224A of the trench 270 of TI-BJT 245 and the active area of the planar-etched JBS diode 248. In addition to etching and etching mask 204 for the TI-BJT 245 active area, for example, an additional masking material 202 may be formed to protect Schottky regions of the JBS diode 248 from ion implantation 201.

Figure 5C:
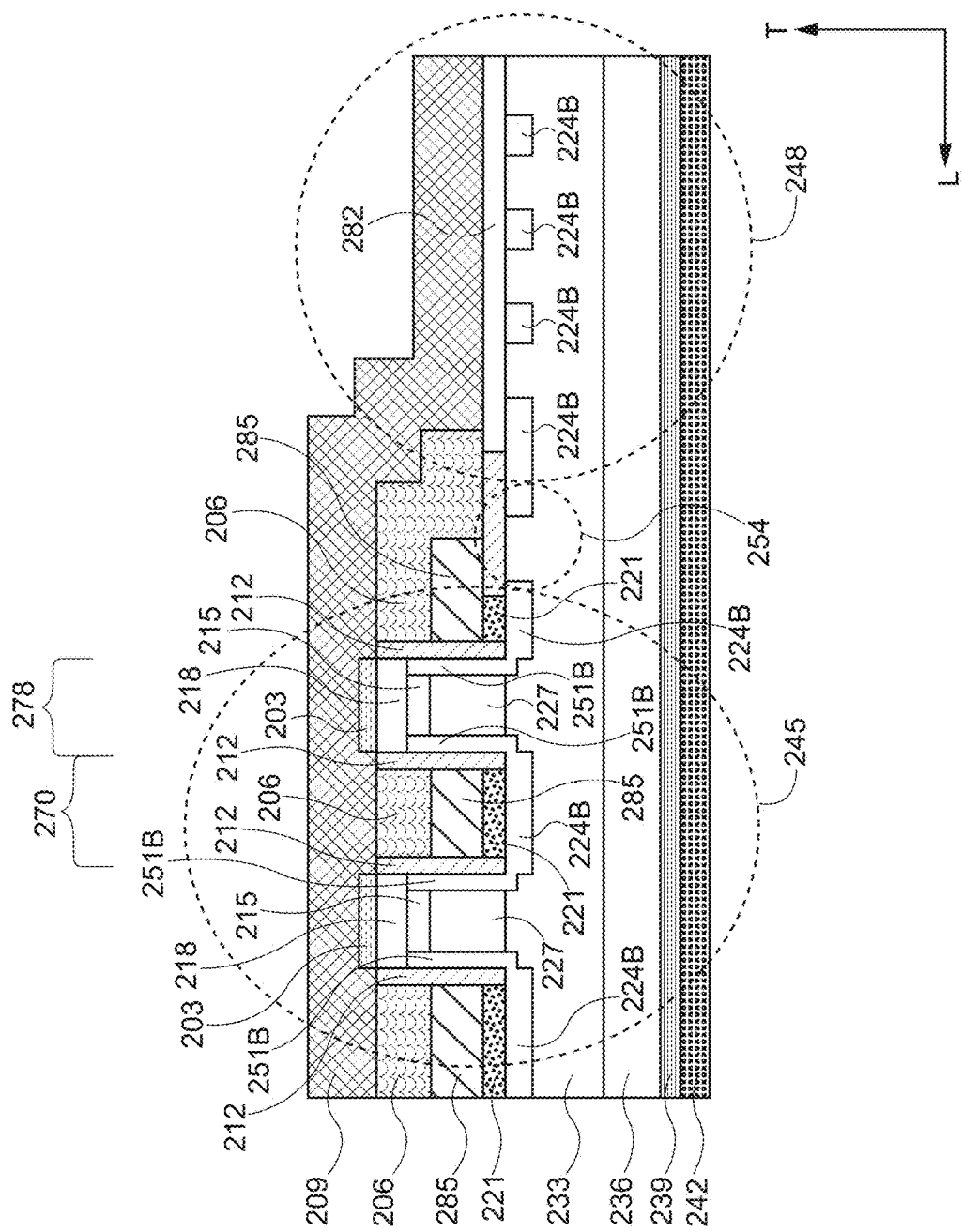
FIG. 5C illustrates cross-sectional view of another exemplary embodiment of a fabricated all-epitaxial monolithically integrated TI-BJT and planar-etched JBS diode.

FIG. 5C illustrates a schematic cross-sectional view of a fabricated all-epitaxial monolithically integrated TI-BJT 245 and planar-etched JBS diode 248. In an example embodiment, this approach may enable the JBS diode 248 active structure to be independently defined without forming, for example, high-aspect ratio trenches 270.

Figure 6A:
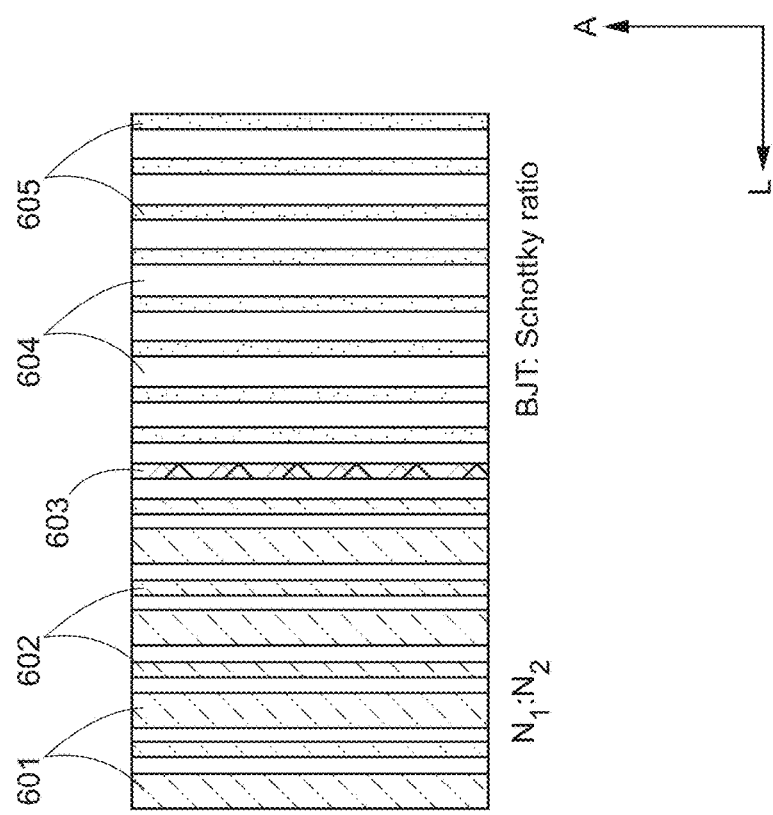
FIG. 6A illustrates a schematic device cell layout of another exemplary embodiment of TI-BJT and implanted monolithically integrated JBS diode regions.

FIG. 6A-D show an example embodiment of exemplary schematic arrangements of BJT and diode unit cells within a monolithically integrated device structure from above the device structure along the transverse direction T. FIG. 6A illustrates an example embodiment of a basic stripe layout, where the interdigitated TI-BJT 245 mesa 601 of the emitter 601 and base ohmic contacts 602 are separated with an isolation region 603 from linear Schottky 604 and implanted 605 patterns of an integrated diode. In an example embodiment, the ratio N1:N2 of emitter mesa 278 to Schottky regions may be determined based on required ratio of TI-BJT 245 and diode 248 forward currents.

Figure 6B:
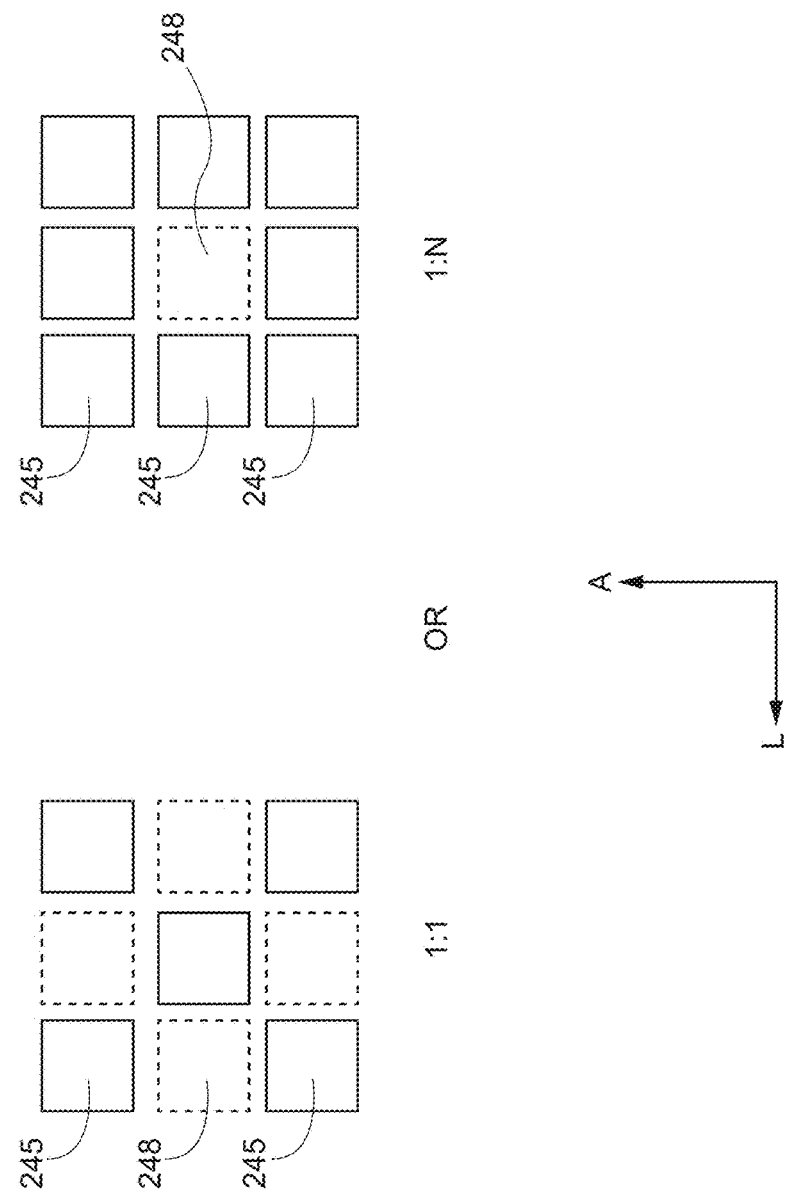
FIG. 6B illustrates a schematic device cell layout of another exemplary embodiment of the TI-BJT and implanted monolithically integrated JBS diode regions, with a staggered closed cell arrangement of BJT and JBS cells.

FIG. 6B illustrates an example embodiment of a staggered closed cell arrangement of TI-BJT 245 and diode 248 unit cells within the monolithically integrated device structure. In an example embodiment, the ratio of diode 248 area to TI-BJT 245 region may be 1:1 or 1:N and may be determined based on required ratio of the forward currents of the TI-BJT 245 and diode 248.

FIG. 6C illustrates an example embodiment of schematic hexagonal cell arrangement of TI-BJT 245 and diode 248 unit cells within monolithically integrated device structure. In an example embodiment, the ratio of hexagon side lengths L1:L2 may be determined based on required ratio of the forward currents of the TI-BJT 245 and diode 248.

Figure 6D:
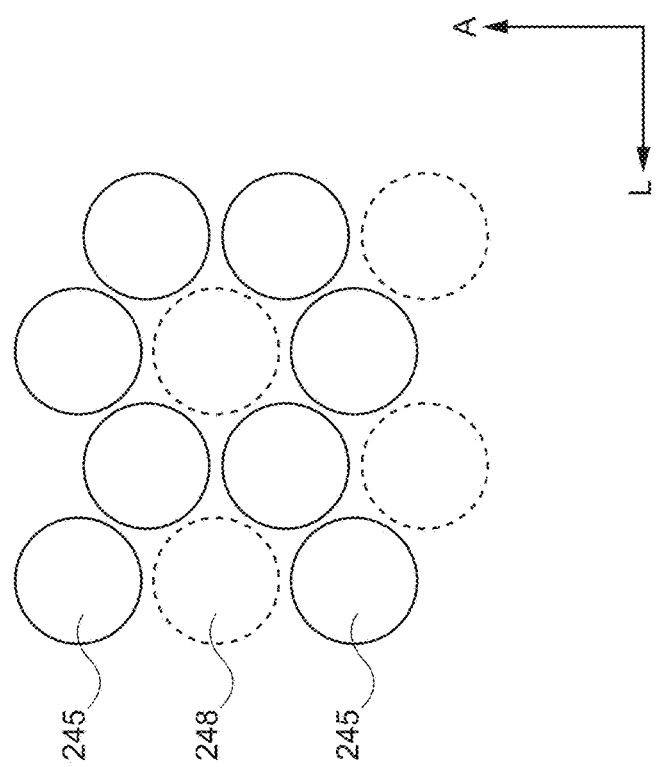
FIG. 6D illustrates a schematic device cell layout of another exemplary embodiment of TI-BJT and implanted monolithically integrated JBS diode regions, with a circular cell arrangement of BJT and JBS cells.

FIG. 6D illustrates an example embodiment of a cell arrangement of circular TI-BJT 245 and circular diode 248 unit cells within the monolithically integrated device structure.

In an example embodiment, the JBS diode 248 may inject minority carriers into the drift layer 233. If JBS diode 248, for example, operates in bipolar mode, i.e. injects minority carriers into the drift layer 233, it may be referred to an MPS (merged PiN-Schottky). For example, instead of JBS diode 248, a pure Schottky diode may be manufactured by eliminating ion implantation of first conductivity type into JBS diode 248 active area. In another example embodiment, a Schottky contact may be formed over the wide area. A PiN diode, for example, may be defined by implanting the entire diode 248 active area with the dopants of first conductivity type, and forming the anode ohmic contact instead of Schottky.

Figure 7A:
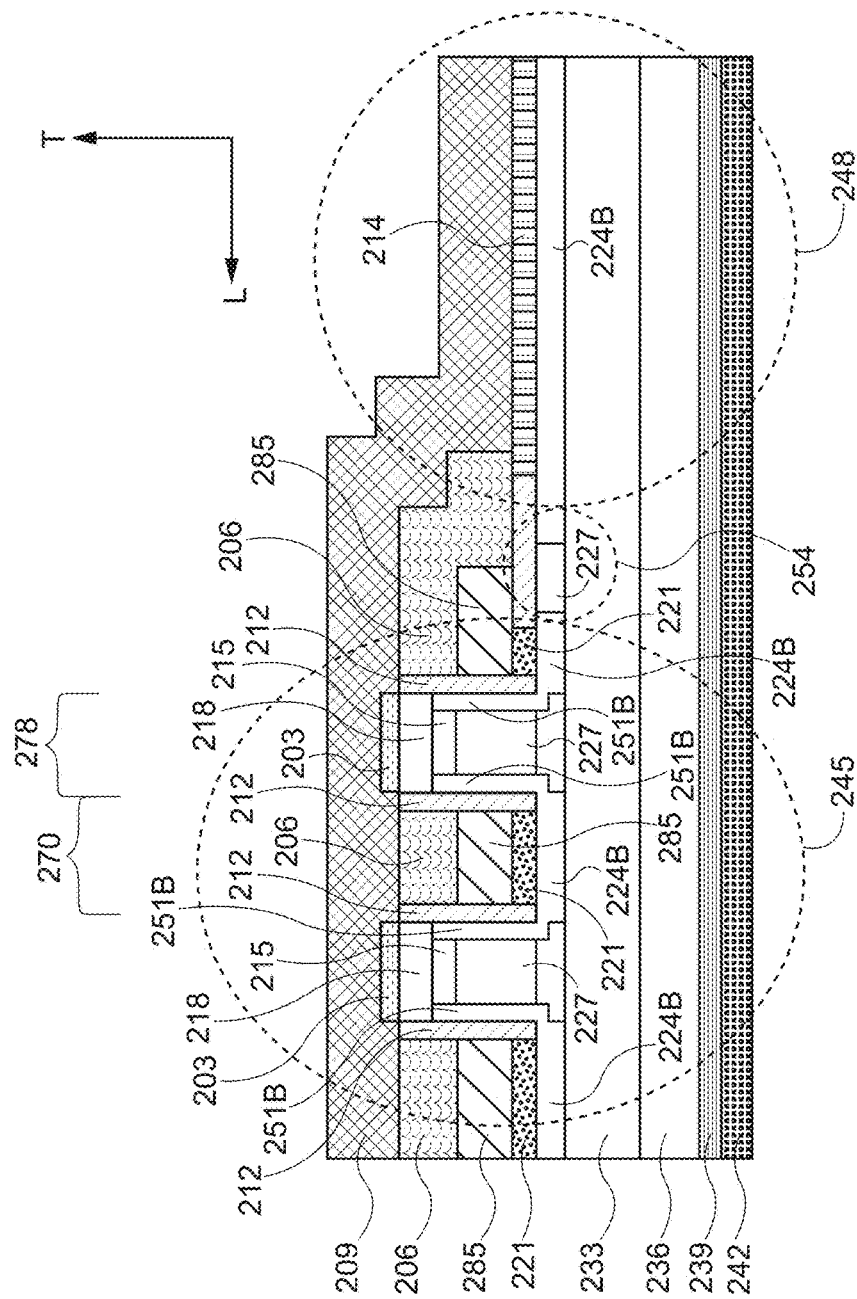
FIG. 7A illustrates a cross-sectional view of another exemplary embodiment of a fabricated discrete TI-BJT monolithically integrated with planar-etched PiN.

FIG. 7A illustrates an example embodiment of a schematic cross-sectional view of a fabricated TI-BJT 245 monolithically integrated with planar-etched PiN diode 249. As further illustrated in FIG. 7A, the monolithic integration of the TI-BJT 245 may also consist of an anode ohmic contact 214 of the diode.

Figure 7B:
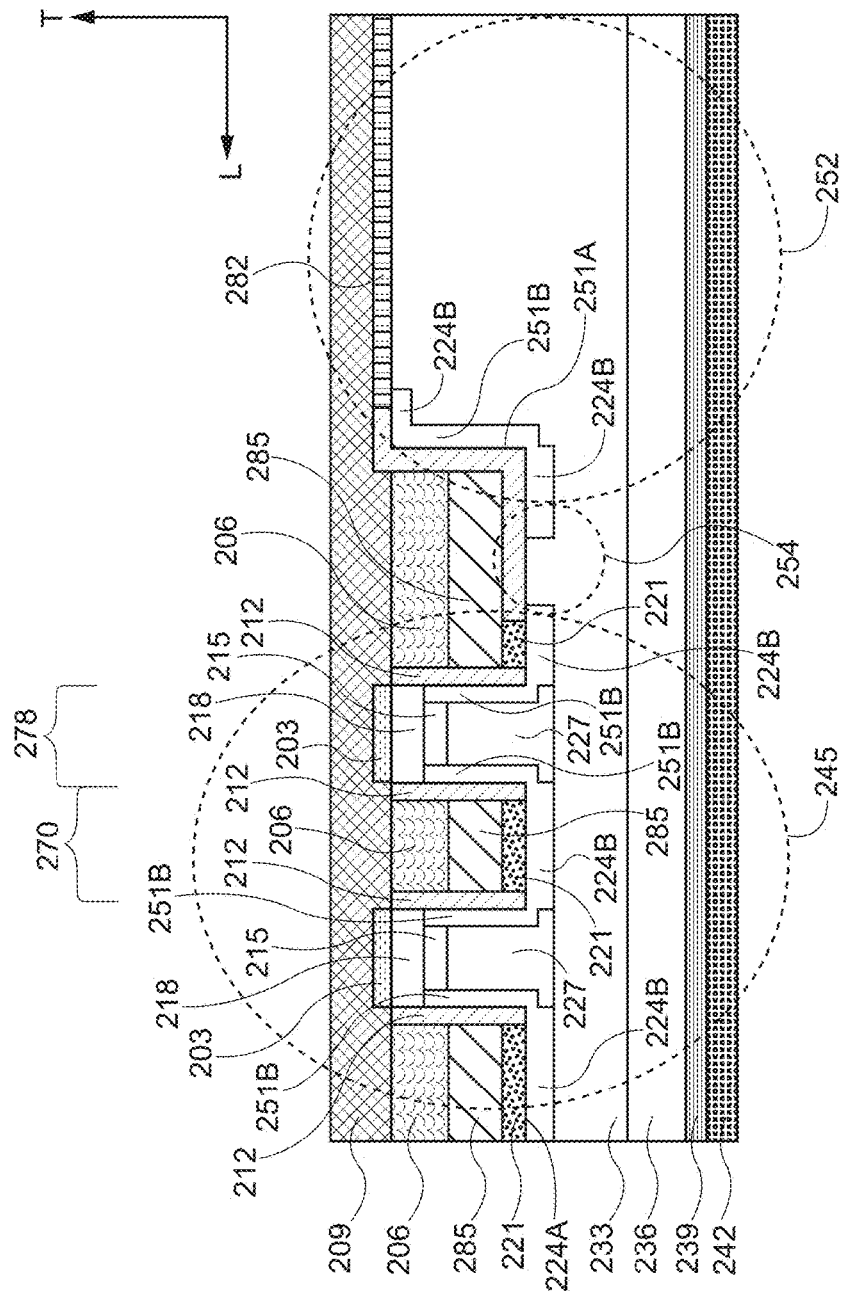
FIG. 7B illustrates a cross-sectional view of another exemplary embodiment of a fabricated discrete TI-BJT monolithically integrated with planar non-etched Schottky diode (SBD).

FIG. 7B illustrates a schematic cross-sectional view of a fabricated TI-BJT 245 monolithically integrated with planar-unetched Schottky diode 252. As further illustrated in FIG. 7B, the monolithic integration of the TI-BJT 245 may also consist of an anode contact 282 of the diode 252. It should be understood that anode contact may also be referred to as an anode Schottky contact.

As depicted and disclosed in the above figures, it should be understood that the various embodiments of the BJT and antiparallel diodes may be understood with reference to a first, second, and third direction such as, for example, lateral direction 'A', a longitudinal direction 'L' which is perpendicular to lateral direction 'A', and a transverse direction 'T' which is perpendicular to longitudinal direction 'L.' As illustrated in the above figures, the longitudinal direction L and the lateral direction A extend horizontally as illustrated, and the transverse direction T extends vertically, though it should be appreciated that these directions may change depending, for instance, on the orientation of TI-BJT.

For example, in FIGS. 2A-2J, the transverse direction T and the longitudinal direction L are shown while the lateral direction A extends into and out of the page. Side-walls 251A of the respective trenches 270 may be substantially planar walls 251A which extend in the transverse direction T and the lateral direction A. Similarly, implanted regions 251B in side walls 251A may also extend in the transverse direction T and the lateral direction A. The side walls 251A of each trench 270 and mesa 278 may be spaced apart from one another along the longitudinal direction L. Side walls 251A may extend fully or partially through one or more of substrate layer 236, drift layer 233, channel layer 227, base layer 215, and emitter layer 218 along the transverse direction T.

Side-walls 251A may be understood to be side-walls 251A of mesas 278 as well as trenches 270. The height of consecutive side-walls 278 may further define the depth of an exemplary trench 270 as well as the height of an exemplary mesa 278. For example, consecutive side-walls may each have a height defined by the distance each side-wall extends (1) in the transverse direction T, (2) between the top of the mesa and the bottom surface 224A of the mesa, and (3) through one or more of substrate layer 236, drift layer 233, channel layer 227, base layer 215, and emitter layer 218. In an exemplary embodiment, the height of consecutive side walls may exclude contacts 203, 221 formed in the trench or on top of the mesa. Exemplary mesas 278 may have a width defined by the distance consecutive side walls 251A are spaced apart from one another along the longitudinal direction L. Similarly, exemplary trenches 270 may have a width defined by the distance consecutive side walls 251A which are spaced apart from one another along the longitudinal direction L.

Further, bottom surfaces 224A of trenches 270 may also be substantially planar and extend in the longitudinal direction L and the lateral direction A. Respective layers, such as substrate layer 236, drift layer 233, channel layer 227, base layer 215, and emitter layer 218, may each have a substantially planar upper and lower surface (when moving along the transverse direction T from the emitter layer 218 towards the channel layer 227) which extend along the longitudinal direction L and the lateral direction A. These layers may also have a thickness, which extends along the transverse direction, and be stacked one on top of another along the transverse direction T. Similarly, implanted regions 224B of the first conductivity type may also extend along the bottom surface 224A of the trench.

For example, in accordance with the various embodiments disclosed herein, a trenched-and-implanted bipolar junction transistor (TI-BJT) is disclosed. The TI-BJT may include a drift layer of a second conductivity type; a channel layer of the second conductivity type formed on top of the drift layer; a base layer of a first conductivity type formed on top of the channel layer, wherein the base layer has a thickness which extends along a first direction, wherein the thickness is in the range of 0.02 to 2 microns; and an emitter layer of the second conductivity type formed on top of the base layer, the emitter layer having a bottom surface located adjacent to the base layer and a top surface opposite the first bottom surface along the first direction. The TI-BJT may also include at least one U-shaped trench formed in at least the emitter layer, base layer, and channel layer. The at least one U-shaped trench may include: a first side surface, a second side surface, and a bottom surface, the first side surface, second side surface, and the bottom surface being substantially planar; the first and the second side surfaces spaced apart along a second direction, the second direction being perpendicular to the first direction, the first and second side surfaces extending (1) along the first direction, (2) from the top surface of the emitter layer to the bottom surface of the at least one U-shaped trench, and (3) through the emitter layer, through the base layer, and at least partially into the channel layer; and the bottom surface of the at least one U-shaped trench extending (1) along the second direction and (2) between the first and the second wall of the at least one U-shaped trench. The TI-BJT may further include at least one implanted U-shaped conductivity region of the first conductivity type, the U-shaped region of the first conductivity type comprising: a first portion extending along the bottom surface of the at least one U-shaped trench; a second portion and a third portion extending (1) along the first and the second side surfaces of the at least one U-shaped trench, respectively, and (2) between the bottom surface of the emitter layer and the bottom surface of the at least one U-shaped trench; and a base electrode disposed between the first and the second side surfaces of the at least one U-shaped trench.

In another embodiment, the TI-BJT may also include a second U-shaped trench formed in the emitter layer, base layer, and channel layer, the second U-shaped trench including: a first side surface, a second side surface, and a bottom surface, the first side surface, second side surface, and the bottom surface being substantially planar; the first and the second side surfaces of the second U-shaped trench spaced apart along a second direction, the second direction being perpendicular to the first direction, the first and second side surfaces extending (1) along the first direction, (2) from the top surface of the emitter layer to the bottom surface of the second U-shaped trench, and (3) through the emitter layer, through the base layer, and at least partially into the channel layer; and the bottom surface of the second U-shaped trench extending (1) along the second direction and (2) between the first and the second wall of the second U-shaped trench; a second implanted U-shaped conductivity region of the first conductivity type, the U-shaped region of the first conductivity type comprising: a first portion extending along the bottom surface of the second U-shaped trench; a second portion and a third portion extending (1) along the first and the second side surfaces of the second U-shaped trench, respectively, and (2) between the bottom surface of the emitter layer and the bottom surface of the second U-shaped trench; and a base electrode disposed between the first and the second side surfaces of the second U-shaped trench. The TI-BJT may also include at least one mesa, the at least one mesa comprising: a first side wall defined by the first side wall of the at least one U-shaped trench and a second side wall defined by the second side wall of the second U-shaped trench; and an unetched region of the emitter layer, base layer, and channel layer extending between the first and the second side walls of the at least one mesa.

In yet another embodiment, the TI-BJT may include an antiparallel diode, monolithically integrated with the TI-BJT, the antiparallel diode comprising an anode electrode and a cathode electrode; a first electric connection between the emitter electrode of the TI-BJT and the anode electrode of the antiparallel diode; wherein the collector electrode of the TI-BJT is the cathode electrode of the antiparallel diode; an electrically inactive isolation region, the electrically inactive isolation region providing an electric isolation between the anode electrode of the antiparallel diode and the base electrode of the BJT, wherein the electrically inactive isolation region increases voltage blocking capability between the BJT base and JBS anode; and a shared edge termination region for the TI-BJT and the antiparallel diode.

In another further embodiment of an integrated TI-BJT and antiparallel diode, the TI-BJT may include at least one of the first side and the second side of the at least one U-shaped trench of the TI-BJT extend a first distance along the first direction, and the emitter layer and the base layer of the TI-BJT formed by ion implantation of the channel layer. The antiparallel diode may include a trenched-and-implanted Junction Barrier Schottky diode (TI-JBS diode), the TI-JBS diode comprising: the drift layer; the channel layer; two adjacent trenches, the two adjacent trenches spaced a second distance from one another along the second direction; and at least one of the two adjacent trenches having a depth that extends the first distance along the first direction; and a mesa, the mesa comprising: a first side wall and a second side wall of the mesa defined by the depth of the at least two adjacent trenches; an unetched and implanted region of the channel layer extending between the first and the second side walls of the mesa, the unetched and implanted region of the mesas including a top surface of the channel layer that is coplanar with the top surface of the emitter layer of the TI-BJT along the second direction; a second and a third implanted conductivity region of the first conductivity type extending along the first and second side walls of the mesa, respectively; and an electrical contact formed on the top surface of the mesa.

In another embodiment of an integrated TI-BJT and antiparallel diode, the TI-BJT may include the emitter, base, and channel layers of the TI-BJT formed by ion implantation of the drift layer. The antiparallel diode may include an unetched Junction Barrier Schottky diode (JBS diode) comprising: the drift layer, the drift layer including a top surface that is coplanar with the top surface of the emitter layer of the TI-BJT along the second direction; a second and a third implanted conductivity region of the first conductivity type extending from the top surface of the drift layer into the drift layer, the second and third implanted conductivity regions being separated by an implanted region of the second conductivity type along the second direction; and a vertical etched step extending along the first direction, the vertical etched step disposed between the isolation region and the second and third implanted regions along the second direction.

In yet another embodiment of an integrated TI-BJT and antiparallel diode, the TI-BJT may include the emitter, base, and channel layers of the TI-BJT formed by ion implantation of the drift layer. The antiparallel diode may include a planar, unetched Junction Barrier Schottky diode (JBS diode) comprising: the drift layer, the drift layer including a top surface that is coplanar with the top surface of the emitter layer of the TI-BJT along the second direction; a second and a third implanted conductivity region of the first conductivity type extending from the top surface of the drift layer into the drift layer, the second and third implanted conductivity regions being separated by an implanted region of the second conductivity type along the second direction; and a sloped side wall extending along the first and the second directions, the sloped side wall disposed between the isolation region and the second and third implanted regions along the second direction.

In yet another embodiment of an integrated TI-BJT and antiparallel diode, the TI-BJT may include at least one of the first side and the second side of the at least one U-shaped trench of the TI-BJT which extend a first distance along the first direction, and the emitter, base, and channel layers of the TI-BJT are formed epitaxially. The antiparallel diode may include a trenched-and-implanted Junction Barrier Schottky diode (TI-JBS diode), the TI-JBS diode comprising: the drift layer; the channel layer; two adjacent trenches, the two adjacent trenches spaced a second distance from one another along the second direction; at least one of the two adjacent trenches having a depth that extends a third distance along the first direction, the third distance being less than the first distance; a mesa, the mesa comprising: a first side wall and a second side wall of the mesa defined by the depth of the at least two adjacent trenches; an etched and implanted region of the channel layer extending between the first and the second side walls of the mesa, the etched and implanted region of the mesa including a top surface of the channel layer that is below with the top surface of the emitter layer of the TI-BJT along the first direction extending from the emitter layer towards the base layer; a second and a third implanted conductivity region of the first conductivity type extending along the first and second side walls of the mesa, respectively; and an electrical contact formed on the top surface of the mesa.

In an embodiment of an integrated TI-BJT and antiparallel diode, the TI-BJT may include the emitter, base, and channel layers of the TI-BJT are formed epitaxially or by ion implantation. The antiparallel diode may include a planar, etched Junction Barrier Schottky diode (JBS diode) comprising: the drift layer, the drift layer being implanted and including an etched top surface that is disposed below the channel layer of the TI-BJT along the first direction extending from the emitter layer towards the channel layer; a second and a third implanted conductivity region of the first conductivity type extending from the top surface of the drift layer into the drift layer, the second and third implanted conductivity regions being separated by an implanted region of the second conductivity type along the second direction.

Methods of forming the above embodiments are also disclosed.

In the exemplary embodiments described above in connection with FIGS. 2A-7B, the thickness of base layer 215 may be in the range of 20 nm to 1000 nm. In another embodiment, the thickness of the drift layer 233 may be in the range of 0.1 microns to 1000 microns. In an example embodiment, the depths of regions 251B and 224B may be in the range of 20 nm to 1000 nm or in the range 0.02 to 2 microns. In an example embodiment, the ratio of the width of an exemplary mesa 278 in the BJT region 245 (i.e., a BJT mesa 278) to its height (i.e., the trench depth) may be in the range of 1:6 to 2:1. In another exemplary embodiment, the ratio of the width of a BJT mesa 278 to its height (i.e., the trench depth) may be in the range of 1:6 to 6:1. In an embodiment, the base layer 215 may have a thickness is in the range of 0.02 to 2 microns. In another embodiment, the emitter electrode 203 may have a thickness of 0.1 to 2 microns.

It should be understood that, the semiconductor devices, described herein, may be manufactured from semiconductor materials, such as Si, SiC, GaAs, diamond, InP, AlN, GaN. BJTs made in silicon carbide (SiC), including its polytypes such as 4H-, 6H-, or 3C-SiC may be of interest for power conversion applications due to their high voltage blocking capability and very low conduction losses. In an example embodiment, the same blocking voltage may be achieved in SiC with, for example, ~10× thinner drift layers than in silicon, that may result in smaller stored minority carrier charge and faster device turn-off time. The on-resistance of a SiC BJT may increase with temperature, while the common emitter current gain may decrease, which may make device paralleling easy and eliminates thermal run-away.

In accordance with the exemplary embodiments of the invention described above JBS diodes may be replaced with PiN diodes or pure SBD (Schottky Barrier Diode).

When ranges are used herein for physical properties, such as molecular weight, or chemical properties, such as chemical formulae, all combinations, and sub combinations of ranges for specific embodiments therein are intended to be included.

The disclosures of each patent, patent application, and publication cited or described in this document are hereby incorporated herein by reference, in its entirety.

In describing preferred embodiments of the subject matter of the present disclosure, as illustrated in the figures, specific terminology is employed for the sake of clarity. The claimed subject matter, however, is not intended to be limited to the specific terminology so selected, and it is to be understood that each specific element includes all technical equivalents that operate in a similar manner to accomplish a similar purpose.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed:

1. A trenched-and-implanted bipolar junction transistor (TI-BJT) comprising:
a drift layer of a second conductivity type;
a collector layer beneath the drift layer;
a channel layer of the second conductivity type formed on top of the drift layer;
a base layer of a first conductivity type formed on top of the channel layer, wherein the base layer has a thickness which extends along a first direction, wherein the thickness is in the range of 0.02 to 2 microns;
an emitter layer of the second conductivity type formed on top of the base layer, the emitter layer having a bottom surface located adjacent to the base layer and a top surface opposite the first bottom surface along the first direction;
at least one U-shaped trench formed in at least the emitter layer, base layer, and channel layer, the at least one U-shaped trench including:
a first side surface, a second side surface, and a bottom surface, the first side surface, second side surface, and the bottom surface being substantially planar;
the first and the second side surfaces spaced apart along a second direction, the second direction being perpendicular to the first direction, the first and second side surfaces extending (1) along the first direction, (2) from the top surface of the emitter layer to the bottom surface of the at least one U-shaped trench, and (3) through the emitter layer, through the base layer, and at least partially into the channel layer; and
the bottom surface of the at least one U-shaped trench extending (1) along the second direction and (2) between the first and the second wall of the at least one U-shaped trench;
at least one implanted U-shaped conductivity region of the first conductivity type, the U-shaped region of the first conductivity type comprising:
a first portion extending along the bottom surface of the at least one U-shaped trench;
a second portion and a third portion extending (1) along the first and the second side surfaces of the at least one U-shaped trench, respectively, and (2) between the bottom surface of the emitter layer and the bottom surface of the at least one U-shaped trench; and
a base electrode disposed between the first and the second side surfaces of the at least one U-shaped trench.

2. The TI-BJT of claim 1, further comprising:
a second U-shaped trench formed in the emitter layer, base layer, and channel layer, the second U-shaped trench including:
a first side surface, a second side surface, and a bottom surface, the first side surface, second side surface, and the bottom surface being substantially planar;
the first and the second side surfaces of the second U-shaped trench spaced apart along a second direction, the second direction being perpendicular to the first direction, the first and second side surfaces extending (1) along the first direction, (2) from the top surface of the emitter layer to the bottom surface of the second U-shaped trench, and (3) through the emitter layer, through the base layer, and at least partially into the channel layer; and
the bottom surface of the second U-shaped trench extending (1) along the second direction and (2) between the first and the second wall of the second U-shaped trench;
a second implanted U-shaped conductivity region of the first conductivity type, the U-shaped region of the first conductivity type comprising:

a first portion extending along the bottom surface of the second U-shaped trench;

a second portion and a third portion extending (1) along the first and the second side surfaces of the second U-shaped trench, respectively, and (2) between the bottom surface of the emitter layer and the bottom surface of the second U-shaped trench;

a base electrode disposed between the first and the second side surfaces of the second U-shaped trench; and at least one mesa, the at least one mesa comprising:

a first side wall defined by the first side wall of the at least one U-shaped trench and a second side wall defined by the second side wall of the second U-shaped trench; and an unetched region of the emitter layer, base layer, and channel layer extending between the first and the second side walls of the at least one meas.

3. The TI-BJT of claim 2, wherein the unetched regions of the base layer and the channel layer of the at least one mesa extend between the second portion of the at least one U-shaped conductivity region and the third portion of the second U-shaped conductivity region.

4. The TI-BJT of claim 2, wherein the at least one mesa has a height defined by a first distance that extends between the top surface of the emitter layer and the bottom surface of the at least one U-shaped trench;

wherein the mesa has a width defined by a second distance that extends between the first side wall and the second side wall of the at least one mesa, wherein a ratio between the second distance and the first distance is a range of 1:6 to 6:1.

5. The TI-BJT of claim 1, further comprising:

an antiparallel diode, monolithically integrated with the TI-BJT, the antiparallel diode comprising an anode electrode and a cathode electrode;

a first electric connection between the emitter electrode of the TI-BJT and the anode electrode of the antiparallel diode;

wherein the collector electrode of the TI-BJT is the cathode electrode of the antiparallel diode;

an electrically inactive isolation region, the electrically inactive isolation region providing an electric isolation between the anode electrode of the antiparallel diode and the base electrode of the BJT, wherein the electrically inactive isolation region increases voltage blocking capability between the BJT base and JBS anode; and a shared edge termination region for the TI-BJT and the antiparallel diode.

6. The integrated TI-BJT and antiparallel diode of claim 5, wherein the first electrical connection is a shared piece of metal.

7. The integrated TI-BJT and antiparallel diode of claim 5, wherein the TI-BJT includes:

at least one of the first side and the second side of the at least one U-shaped trench of the TI-BJT extend a first distance along the first direction, the emitter layer and the base layer of the TI-BJT formed by ion implantation of the channel layer, wherein the antiparallel diode includes a trenched-and-implanted Junction Barrier Schottky diode (TI-JBS diode), the TUBS diode comprising the drift layer;

the channel layer;

two adjacent trenches, the two adjacent trenches spaced a second distance from one another along the second direction; and at least one of the two adjacent trenches having a depth that extends the first distance along the first direction; and a mesa, the mesa comprising:

a first side wall and a second side wall of the mesa defined by the depth of the at least two adjacent trenches;

an unetched and implanted region of the channel layer extending between the first and the second side walls of the mesa, the unetched and implanted region of the mesas including a top surface of the channel layer that is coplanar with the top surface of the emitter layer of the TI-BJT along the second direction; and a second and a third implanted conductivity region of the first conductivity type extending along the first and second side walls of the mesa, respectively; and an electrical contact formed on the top surface of the mesa.

8. The integrated TI-BJT and antiparallel diode of claim 5, wherein the TI-BJT includes:

the emitter, base, and channel layers of the TI-BJT formed by ion implantation of the drift layer, wherein the antiparallel diode includes a planar, unetched Junction Barrier Schottky diode (JBS diode) comprising:

the drift layer, the drift layer including a top surface that is coplanar with the top surface of the emitter layer of the TI-BJT along the second direction;

a second and a third implanted conductivity region of the first conductivity type extending from the top surface of the drift layer into the drift layer, the second and third implanted conductivity regions being separated by an implanted region of the second conductivity type along the second direction; and a sloped side wall extending along the first and the second directions, the sloped side wall disposed between the isolation region and the second and third implanted regions along the second direction.

9. The integrated TI-BJT and antiparallel diode of claim 5, wherein the TI-BJT includes:

at least one of the first side and the second side of the at least one U-shaped trench of the TI-BJT extend a first distance along the first direction, the emitter, base, and channel layers of the TI-BJT are formed epitaxially, wherein the antiparallel diode includes a trenched-and-implanted Junction Barrier Schottky diode (TI-JBS diode), the TI-JBS diode comprising the drift layer;

the channel layer;

two adjacent trenches, the two adjacent trenches spaced a second distance from one another along the second direction; and at least one of the two adjacent trenches having a depth that extends a third distance along the first direction, the third distance being less than the first distance; and a mesa, the mesa comprising:

a first side wall and a second side wall of the mesa defined by the depth of the at least two adjacent trenches;

an etched and implanted region of the channel layer extending between the first and the second side walls of the mesa, the etched and implanted region of the mesa including a top surface of the channel layer that is below with the top surface of the emitter layer of the TI-BJT along the first direction extending from the emitter layer towards the base layer; and a second and a third implanted conductivity region of the first conductivity type extending along the first and second side walls of the mesa, respectively; and an electrical contact formed on the top surface of the mesa.

10. The integrated TI-BJT and antiparallel diode of claim 5,
wherein the TI-BJT includes:
the emitter, base, and channel layers of the TI-BJT are formed epitaxially or by ion implantation,
wherein the antiparallel diode includes a planar, etched Junction Barrier Schottky diode (JBS diode) comprising:
the drift layer, the drift layer being implanted and including an etched top surface that is disposed below the channel layer of the TI-BJT along the first direction extending from the emitter layer towards the channel layer;
a second and a third implanted conductivity region of the first conductivity type extending from the top surface of the drift layer into the drift layer, the second and third implanted conductivity regions being separated by an implanted region of the second conductivity type along the second direction.

11. The integrated TI-BJT and antiparallel diode of claim 5, wherein the TI-BJT or antiparallel diode comprise wide band gap (WBG) semiconductor materials, wherein the WBG semiconductor materials includes at least one of 4H-silicon carbide, 6H-silicon carbide, 3C-silicon carbide, GaAs, GaN, InP, AlN, or diamond.

12. A self-aligned method of forming trenched-and-implanted bipolar junction transistor (TI-BJT) comprising:
forming a drift layer of a second conductivity type;
forming a collector layer beneath the drift layer;
forming a channel layer of the second conductivity type on top of the drift layer;
forming a base layer of a first conductivity type on top of the channel layer, wherein the base layer has a thickness which extends along a first direction, wherein the thickness is in the range of 0.02 to 2 microns;
forming an emitter layer of the second conductivity type on top of the base layer, the emitter layer having a bottom surface located adjacent to the base layer and a top surface opposite the first bottom surface along the first direction;
forming at least one U-shaped trench in at least the emitter layer, base layer, and channel layer, the at least one U-shaped trench including:
a first side surface, a second side surface, and a bottom surface, the first side surface, second side surface, and the bottom surface being substantially planar;
the first and the second side surfaces spaced apart along a second direction, the second direction being perpendicular to the first direction, the first and second side surfaces extending (1) along the first direction, (2) from the top surface of the emitter layer to the bottom surface of the at least one U-shaped trench, and (3) through the emitter layer, through the base layer, and at least partially into the channel layer; and
the bottom surface of the at least one U-shaped trench extending (1) along the second direction and (2) between the first and the second wall of the at least one U-shaped trench;

forming at least one implanted U-shaped conductivity region of the first conductivity type, the U-shaped region of the first conductivity type comprising:
a first portion extending along the bottom surface of the at least one U-shaped trench;
a second portion and a third portion extending (1) along the first and the second side surfaces of the at least one U-shaped trench, respectively, and (2) between the bottom surface of the emitter layer and the bottom surface of the at least one U-shaped trench; and
a base electrode disposed between the first and the second side surfaces of the at least one U-shaped trench.

13. The method of claim 12, further comprising:
forming an antiparallel diode, wherein the antiparallel diode is monolithically integrated with the TI-BJT, the antiparallel diode comprising an anode electrode and a cathode electrode;
forming a first electric connection between the emitter electrode of the TI-BJT and the anode electrode of the antiparallel diode;
wherein the collector electrode of the TI-BJT is the cathode electrode of the antiparallel diode;
forming an electrically inactive isolation region, the electrically inactive isolation region providing an electric isolation between the anode electrode of the antiparallel diode and the base electrode of the BJT, wherein the electrically inactive isolation region increases voltage blocking capability between the BJT base and JBS anode; and
forming a shared edge termination region for the TI-BJT and the antiparallel diode.

14. The method of claim 12,
wherein the TI-BJT includes:
at least one of the first side and the second side of the at least one U-shaped trench of the TI-BJT extend a first distance along the first direction,
the emitter layer and the base layer of the TI-BJT formed by ion implantation of the channel layer,
wherein the antiparallel diode includes a trenched-and-implanted Junction Barrier Schottky diode (TI-JBS diode), the TUBS diode comprising
the drift layer;
the channel layer;
two adjacent trenches, the two adjacent trenches spaced a second distance from one another along the second direction; and
at least one of the two adjacent trenches having a depth that extends the first distance along the first direction; and
a mesa, the mesa comprising:
a first side wall and a second side wall of the mesa defined by the depth of the at least two adjacent trenches;
an unetched and implanted region of the channel layer extending between the first and the second side walls of the mesa, the unetched and implanted region of the mesas including a top surface of the channel layer that is coplanar with the top surface of the emitter layer of the TI-BJT along the second direction; and
a second and a third implanted conductivity region of the first conductivity type extending along the first and second side walls of the mesa, respectively; and
an electrical contact formed on the top surface of the mesa.

15. The method of claim 12,
wherein the TI-BJT includes:
the emitter, base, and channel layers of the TI-BJT formed by ion implantation of the drift layer, wherein the antiparallel diode includes a planar, unetched Junction Barrier Schottky diode (JBS diode) comprising:

the drift layer, the drift layer including a top surface that is coplanar with the top surface of the emitter layer of the TI-BJT along the second direction;

a second and a third implanted conductivity region of the first conductivity type extending from the top surface of the drift layer into the drift layer, the second and third implanted conductivity regions being separated by an implanted region of the second conductivity type along the second direction; and a sloped side wall extending along the first and the second directions, the sloped side wall disposed between the isolation region and the second and third implanted regions along the second direction.

16. The method of claim 12, wherein the TI-BJT includes:

at least one of the first side and the second side of the at least one U-shaped trench of the TI-BJT extend a first distance along the first direction, the emitter, base, and channel layers of the TI-BJT are formed epitaxially, wherein the antiparallel diode includes a trenched-and-implanted Junction Barrier Schottky diode (TI-JBS diode), the TI-JBS diode comprising the drift layer;

the channel layer;

two adjacent trenches, the two adjacent trenches spaced a second distance from one another along the second direction; and at least one of the two adjacent trenches having a depth that extends a third distance along the first direction, the third distance being less than the first distance; and a mesa, the mesa comprising:

a first side wall and a second side wall of the mesa defined by the depth of the at least two adjacent trenches;

an etched and implanted region of the channel layer extending between the first and the second side walls of the mesa, the etched and implanted region of the mesa including a top surface of the channel layer that is below with the top surface of the emitter layer of the TI-BJT along the first direction extending from the emitter layer towards the base layer; and a second and a third implanted conductivity region of the first conductivity type extending along the first and second side walls of the mesa, respectively; and an electrical contact formed on the top surface of the mesa.

17. The method of claim 12, wherein the TI-BJT includes:

the emitter, base, and channel layers of the TI-BJT are formed epitaxially or by ion implantation, wherein the antiparallel diode includes a planar, etched Junction Barrier Schottky diode (JBS diode) comprising:

the drift layer, the drift layer being implanted and including an etched top surface that is disposed below the channel layer of the TI-BJT along the first direction extending from the emitter layer towards the channel layer;

a second and a third implanted conductivity region of the first conductivity type extending from the top surface of the drift layer into the drift layer, the second and third implanted conductivity regions being separated by an implanted region of the second conductivity type along the second direction, wherein the step of forming the at least one U-shaped trench forms the etched top surface the drift layer in the antiparallel diode.

18. The method of claim 12, wherein the edge termination region is electrically connected to the base electrode of the TI-BJT.

19. The method of claim 12, wherein the edge termination region is electrically connected to the anode electrode of the antiparallel diode.

20. The method of claim 12, wherein the TI-BJT or antiparallel diode comprise wide band gap (WBG) semiconductor materials, wherein the WBG semiconductor materials includes at least one of 4H-silicon carbide, 6H-silicon carbide, 3C-silicon carbide, GaAs, GaN, InP, AlN, or diamond.

* * * * *